United States Patent
Murakami et al.

(10) Patent No.: US 10,340,683 B2
(45) Date of Patent: Jul. 2, 2019

(54) LOAD-DRIVING INTEGRATED CIRCUIT DEVICE

(71) Applicant: Mitsubishi Electric Corporation, Tokyo (JP)

(72) Inventors: Takatoshi Murakami, Tokyo (JP); Yuki Iwagami, Tokyo (JP); Mitsunori Nishida, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 169 days.

(21) Appl. No.: 15/646,313

(22) Filed: Jul. 11, 2017

(65) Prior Publication Data
US 2018/0233903 A1 Aug. 16, 2018

(30) Foreign Application Priority Data

Feb. 13, 2017 (JP) .................................. 2017-023790

(51) Int. Cl.
*H01H 9/54* (2006.01)
*G01R 31/327* (2006.01)
(Continued)

(52) U.S. Cl.
CPC .......... *H02H 7/205* (2013.01); *H01H 47/002* (2013.01)

(58) Field of Classification Search
CPC .... H04Q 3/0016; H04Q 3/002; H04Q 3/0029; H04Q 3/52; H04Q 3/521; H04Q 3/523;
(Continued)

(56) References Cited

U.S. PATENT DOCUMENTS

| 7,505,021 B2* | 3/2009 | Fujikura | G09G 3/3688 345/100 |
| 2010/0116236 A1 | 5/2010 | Yamaguchi et al. | |
| 2014/0300405 A1* | 10/2014 | Tian | H03K 17/0822 327/399 |

FOREIGN PATENT DOCUMENTS

| JP | 05036332 A | 2/1993 |
| JP | 07-263632 A | 10/1995 |

(Continued)

OTHER PUBLICATIONS

Communication dated Apr. 24, 2018, from the Japanese Patent Office in counterpart application No. 2017-023790.

(Continued)

*Primary Examiner* — An T Luu
(74) *Attorney, Agent, or Firm* — Sughrue Mion, PLLC; Richard C. Turner

(57) ABSTRACT

To provide a semiconductor device for driving an electric load to be divided into a plurality of opening/closing devices so that when an abnormality exists in any one of the division devices, that division device can be removed and replaced by an auxiliary device. Each of a plurality of opening/closing circuit units has an upper-side opening/closing device and a lower-side opening/closing device; while load driving is stopped, there is monitored the potential of the connection point between the upper and lower opening/closing devices at a time when any one of the opening/closing devices is closed or both of them are opened, and it is determined whether there exists short-circuit abnormality or disconnection abnormality in each of the opening/closing devices. When abnormality exists, the upper and lower opening/closing devices are removed and the auxiliary circuit is made effective.

10 Claims, 23 Drawing Sheets

(51) Int. Cl.
*H02H 7/20* (2006.01)
*H01H 47/00* (2006.01)

(58) Field of Classification Search
CPC .... H03K 17/28; H03K 17/284; H03K 17/687; H03K 17/6878
See application file for complete search history.

(56) References Cited

FOREIGN PATENT DOCUMENTS

| | | |
|---|---|---|
| JP | 2011130077 A | 6/2011 |
| JP | 2014072596 A | 4/2014 |
| JP | 2016213659 A | 12/2016 |
| WO | 2006123654 A1 | 11/2006 |

OTHER PUBLICATIONS

Communication dated Jul. 10, 2018, from Japanese Patent Office in counterpart application No. 2017-023790.

\* cited by examiner

FIG. 5A

SERIES MONITORING SIGNAL SER

| BIT | LOGIC 0 | LOGIC 1 | REMARKS |
|---|---|---|---|
| b0 | T40u UNSHORTED | T40u SHORTED | 1ST COMMUNICATION REPORT OF ABNORMALITY |
| b1 | T40u UNDISCONNECTED | T40u DISCONNECTED | |
| b2 | T40d UNSHORTED | T40d SHORTED | |
| b3 | T40d UNDISCONNECTED | T40d DISCONNECTED | |
| b4 | T50u UNSHORTED | T50u SHORTED | 2ND COMMUNICATION REPORT OF ABNORMALITY |
| b5 | T50u UNDISCONNECTED | T50u DISCONNECTED | |
| b6 | T50d UNSHORTED | T50d SHORTED | |
| b7 | T50d UNDISCONNECTED | T50d DISCONNECTED | |
| b8 | T60u UNSHORTED | T60u SHORTED | 3RD COMMUNICATION REPORT OF ABNORMALITY |
| b9 | T60u UNDISCONNECTED | T60u DISCONNECTED | |
| b10 | T60d UNSHORTED | T60d SHORTED | |
| b11 | T60d UNDISCONNECTED | T60d DISCONNECTED | |
| b12 | 1ST CIRCUIT STOPPED | 1ST CIRCUIT OPERATED | COMMUNICATION REPORT OF OPERATING CIRCUITS |
| b13 | 2ND CIRCUIT STOPPED | 2ND CIRCUIT OPERATED | |
| b14 | 3RD CIRCUIT STOPPED | 3RD CIRCUIT OPERATED | |
| b15 | 4TH CIRCUIT STOPPED | 4TH CIRCUIT OPERATED | |

FIG.5B

SERIES MONITORING SIGNAL

| APPLICATION CLASSIFICATION | b1 | b0 | S40d | S40u |
|---|---|---|---|---|
| | b3 | b2 | S50d | S50u |
| | b5 | b4 | S60d | S60u |
| A | 0 | 0 | OPENING COMMAND | OPENING COMMAND |
| B | 0 | 1 | S 01 | S 10 |
| C | 1 | 0 | S 10 | S 01 |
| D | 1 | 1 | S 00 | S 00 |

FIG. 5C

PARALLEL MONITORING SIGNAL PAR

| BIT | LOGIC 0 | LOGIC 1 |
|---|---|---|
| b0 | NEGATIVE LINE UNSHORTED TO GROUND | NEGATIVE LINE SHORTED TO GROUND |
| b1 | NEGATIVE LINE UNSHORTED TO POWER | NEGATIVE LINE SHORTED TO POWER |
| b2 | LOAD UNDISCONNECTED | LOAD DISCONNECTED |
| b3 | DEVICE NORMALITY (1) | DEVICE ABNORMALITY (2) |

(1) WHEN LOGICS OF ALL SERIES MONITORING SIGNALS b0 TO b11 ARE "0"
(2) WHEN LOGIC OF ANY ONE OF SERIES MONITORING SIGNALS IS "1"
· b0 TO b3 ARE "1" UNTIL INITIAL INSPECTION IS COMPLETED

FIG. 6

NORMAL OPENING/CLOSING OPERATION

| | | USED CIRCUITS 1 | | USED CIRCUITS 2 | | AUXILIARY CIRCUIT | |
|---|---|---|---|---|---|---|---|
| | | D40u | D40d | D50u | D50d | D60u | D60d |
| NORMAL CLOSING | STATE OF COMMAND | 「H」 | 「H」 | 「H」 | 「H」 | 「L」 | 「L」 |
| | STATE OF OPENING/CLOSING | T40u CLOSED | T40d CLOSED | T50u CLOSED | T50d CLOSED | T60u OPENED | T60d OPENED |
| | MONITORING H90u | 「L」 | | 「L」 | | 「L」 | |
| | MONITORING H90m | 「H」 | | 「H」 | | 「H」 | |
| | MONITORING H90d | | | | | | |
| | STATE OF OPENING/CLOSING | H40d = 「H」 H40e = 「H」 | | H50d = 「H」 H50e = 「H」 | | H60d = 「H」 H60e = 「L」 | |
| NORMAL OPENING | STATE OF COMMAND | 「L」 | 「L」 | 「L」 | 「L」 | 「H」 | 「H」 |
| | STATE OF OPENING/CLOSING | T40u OPENED | T40d OPENED | T50u OPENED | T50d OPENED | T60u OPENED | T60d OPENED |
| | MONITORING H90u | 「H」 | | 「H」 | | 「H」 | |
| | MONITORING H90m | 「L」 | | 「L」 | | 「L」 | |
| | MONITORING H90d | 「L」 | | 「L」 | | 「L」 | |
| | STATE OF OPENING/CLOSING | H40m = 「H」 H40e = 「L」 | | H50m = 「H」 H50e = 「L」 | | H60m = 「H」 H60e = 「L」 | |

FIG. 7  EXTERNAL DISCONNECTION/SHORT-CIRCUIT ABNORMALITY

| | | H90u | H90m | H90d | REMARKS |
|---|---|---|---|---|---|
| LOAD UNDRIVEN | NEGATIVE LINE SHORTED TO POWER | 「H」 | 「L」 | 「L」 | INDISTINGUISHABLE FROM NORMAL-LOAD STATE |
| | NEGATIVE LINE SHORTED TO GROUND | 「L」 | 「L」 | 「H」 | MUTUALLY DISTINGUISHABLE |
| | LOAD DISCONNECTED | 「L」 | 「H」 | 「L」 | |
| | LOAD NORMAL | 「H」 | 「L」 | 「L」 | |
| LOAD DRIVEN | NEGATIVE LINE SHORTED TO POWER | 「H」 | 「L」 | 「H」 | ERR GENERATED AND THEN ALL DEVICES OPENED |
| | NEGATIVE LINE SHORTED TO GROUND | 「L」 | 「L」 | 「H」 | NO ELECTRIC CURRENT DETECTED/ INDISTINGUISHABLE |
| | LOAD DISCONNECTED | 「L」 | 「L」 | 「H」 | DISTINGUISHABLE WHEN UNDRIVEN |
| | LOAD NORMAL | 「L」 | 「L」 | 「H」 | ELECTRIC CURRENT DETECTED |

FIG. 8A

SEPARATE ABNORMALITY DETECTION
(EXTERNAL CIRCUIT)

| | STATE OF COMMAND TO OPENING/CLOSING DEVICES | H90u = 「H」 | H90m = 「H」 | H90d = 「H」 | H90u = 「H」 H90d = 「H」 |
|---|---|---|---|---|---|
| BOTH DEVICES OPENED | OPENING COMMAND TO ALL DEVICES | LOAD NORMAL | LOAD DISCONNECTED | NEGATIVE LINE SHORTED TO GROUND | *ERR GENERATED AS NEGATIVE LINE SHORTED TO POWER AND THEN ALL DEVICE OPENING COMMAND GENERATED |
| LOWER DEVICE CLOSED | PART OF OR ALL LOWER DEVICES CLOSED | LOAD NORMAL | LOAD DISCONNECTED | NEGATIVE LINE SHORTED TO GROUND | |
| UPPER DEVICE CLOSED | PART OF OR ALL UPPER DEVICES CLOSED | LOAD NORMAL | LOAD DISCONNECTED | NEGATIVE LINE SHORTED TO GROUND | |
| BOTH DEVICES CLOSED | CLOSING COMMAND TO ALL DEVICES | NEGATIVE LINE SHORTED TO POWER * | LOAD PARTIALLY SHORTED | LOAD NORMAL | |

FIG. 8B

SEPARATE ABNORMALITY DETECTION (1ST CIRCUIT)

| | D40u | D40d | ↓COMPOSITE 41: T40u SHORTED/T40d DISCONNECTED | | | ↓COMPOSITE 42: T40u DISCONNECTED/T40d SHORTED | |
|---|---|---|---|---|---|---|---|
| | | | H40u =「H」 | H40m = 「H」 | H40d = 「H」 | H40u = 「H」 H40d = 「H」 | H40e = 「H」 |
| BOTH DEVICES OPENED | 「L」 | 「L」 | T40u SHORTED | NORMAL | T40d SHORTED | | |
| LOWER DEVICE CLOSED | 「L」 | 「H」 | COMPOSITE 41 | T40d DISCONNECTED | NORMAL | FUSE MELTED | BOTH T40u AND T40d SHORTED |
| UPPER DEVICE CLOSED | 「H」 | 「L」 | NORMAL | T40u DISCONNECTED | COMPOSITE 42 | FUSE MELTED | |
| BOTH DEVICES CLOSED | 「H」 | 「H」 | T40d DISCONNECTED | BOTH DEVICES DISCONNECTED | NORMAL | FUSE MELTED | NORMAL |

FIG. 8C
SEPARATE ABNORMALITY DETECTION
(2ND CIRCUIT)

| | D50u | D50d | H50u = 「H」 | H50m = 「H」 | H50d = 「H」 | H50u = 「H」<br>H50d = 「H」 | H50e = 「H」 |
|---|---|---|---|---|---|---|---|
| | | | ↓COMPOSITE 51: T50u SHORTED/<br>T50d DISCONNECTED | | | ↓COMPOSITE 52: T50u DISCONNECTED/<br>T50d SHORTED | |
| BOTH DEVICES OPENED | 「L」 | 「L」 | T50u SHORTED | NORMAL | T50d SHORTED | | |
| LOWER DEVICE CLOSED | 「L」 | 「H」 | COMPOSITE 51 | T50d DISCONNECTED | NORMAL | FUSE MELTED | BOTH T50u AND T50d SHORTED |
| UPPER DEVICE CLOSED | 「H」 | 「L」 | NORMAL | T50u DISCONNECTED | COMPOSITE 52 | | |
| BOTH DEVICES CLOSED | 「H」 | 「H」 | T50d DISCONNECTED | BOTH DEVICES DISCONNECTED | NORMAL | FUSE MELTED | NORMAL |

FIG. 8D
SEPARATE ABNORMALITY DETECTION
(3RD CIRCUIT)

| | | | COMPOSITE 61: T60u SHORTED/ T60d DISCONNECTED | | | COMPOSITE 62: T60u DISCONNECTED/ T60d SHORTED | |
|---|---|---|---|---|---|---|---|
| | D60u | D60d | H60u = [H] | H60m = [H] | H60d = [H] | H60u = [H] H60d = [H] | H60e = [H] |
| BOTH DEVICES OPENED | [L] | [L] | T60u SHORTED | NORMAL | T60d SHORTED | | |
| LOWER DEVICE CLOSED | [L] | [H] | COMPOSITE 61 | T60d DISCONNECTED | NORMAL | FUSE MELTED | BOTH T60u AND T60d SHORTED |
| UPPER DEVICE CLOSED | [H] | [L] | NORMAL | T60u DISCONNECTED | COMPOSITE 62 | | |
| BOTH DEVICES CLOSED | [H] | [H] | T60d DISCONNECTED | BOTH DEVICES DISCONNECTED | NORMAL | FUSE MELTED | NORMAL |

US 10,340,683 B2

LOAD-DRIVING INTEGRATED CIRCUIT DEVICE

INCORPORATION BY REFERENCE

The disclosure of Japanese Patent Application No. 2017-023790 filed on Feb. 13, 2017 including its specifications, claims and drawings, is incorporated herein by reference in its entirety.

BACKGROUND

The present invention relates to the improvement of a load-driving integrated circuit device having an integrated circuit of semiconductor opening/closing devices for performing frequent on/off control of an energization current for an electric load and for controlling the conduction duty rate, which is the proportion of the circuit-closing time to the opening/closing period, so as to adjust and control the load current; in particular, the present invention relates to a load-driving integrated circuit device that copes with occurrence of a local abnormality related to the semiconductor opening/closing devices and makes it possible to perform continuous operation.

There is publicly known a load-driving integrated circuit device that adjusts the number of parallel-connected opening/closing devices, preliminarily and separately arranged, so as to make the opening/closing devices match with a required current capacity. For example, according to FIG. 2 in Japanese Patent Application No. JP-A-H07-263632 (ABSTRACT, FIGS. 1 and 2, Paragraphs 0027 and 0028), listed below, when the logic of the control signal B is changed from "L" to "H", the transistor 7 is connected in parallel with the load-driving transistor 10 and in response to this, selection of transistors 11 and 12 is performed, i.e., there is disclosed a technology in which in order to change the apparent transistor size, selective connection switching of a plurality of transistors is implemented so as to increase or decrease the number of parallel-connected transistors.

SUMMARY (1) Explanation for Problems in the Prior Art

The semiconductor integrated circuit disclosed in JP-A-H07-263632 is characterized in that when for example, a disconnection abnormality occurs in the parallel transistor 10, the abnormality occurrence state can apparently be recovered by making effective the parallel transistor 7, as a replacement device which replaces the parallel transistor 10. However, because when a short-circuit, abnormality occurs in the parallel transistor 10, the parallel transistor 7 cannot replace the parallel transistor 10, JP-A-H07-263632 is imperfect for the purpose of recovering from the abnormality. Moreover, when a disconnection occurs in any one of the series transistors 11 and 12, this circuit becomes ineffective and irreparable. One of the contributing factors of the abnormality occurrence herein is an initial failure or an accidental failure that occurs when for example, microdust attaches to a semiconductor chip in the production process of a semiconductor integrated circuit and the failure cannot be detected in the performance inspection stage. Another contributing factor of the abnormality occurrence is a deterioration failure that is caused by a disturbance stress such as excessive-voltage noise or excessive current-noise based on an external factor in the practical-use stage of the product in which a semiconductor integrated circuit device is integrated.

(2) Explanation for the Objective of the Present Invention

It is the objective of the present invention that when a disconnection abnormality or a short-circuit abnormality occurs in any one of a plurality of semiconductor opening/closing devices, for driving an electric load, that are separately provided, the abnormal semiconductor opening/closing device is disconnected and the operation is continued or the abnormal semiconductor opening/closing device is replaced by an auxiliary device, when available.

A load-driving integrated circuit device according to the present invention includes:

a calculation control circuit unit that generates a load driving command Son that is a command signal for applying a power-source voltage to an electric load;

an opening/closing device unit that is connected in series with a negative-side load wiring lead or a positive-side load wiring lead of the electric load and has a plurality of semiconductor opening/closing devices;

a monitoring control circuit unit that makes the plurality of semiconductor opening/closing devices perform opening/closing operation in response to the load driving command Son; and an opening/closing device integrated circuit in which the opening/closing device unit and the monitoring control circuit unit are integrated on a semiconductor chip, wherein the opening/closing device unit has a plurality of opening/closing circuit units which are equal to or more than three opening/closing circuit units of a first opening/closing circuit unit, a second opening/closing circuit unit, and a third opening/closing circuit unit, which are connected in parallel with one another, wherein each of the plurality of opening/closing circuit units has upper and lower opening/closing devices which form a pair of upper-side opening/closing device and lower-side opening/closing device which are connected in series with each other, and a connection point potential detection circuit that generates an output voltage corresponding to the potential of the connection point between the upper-side opening/closing device and the lower-side opening/closing device, wherein the calculation control circuit unit has an application circuit selection means that selects an application circuit, which is an opening/closing circuit unit for performing on/off operation of a load current corresponding to the load driving command Son, from the plurality of opening/closing circuit units; in the case where it is determined based on an output voltage of the connection point potential detection circuit that a device disconnection abnormality or a device short-circuit abnormality has occurred in the upper-side opening/closing device or the lower-side opening/closing device, the application circuit selection means removes an opening/closing circuit unit, in which an abnormality has occurred, from the application circuit, and includes an auxiliary circuit, which is a normal opening/closing circuit unit which is not selected as the application circuit, in the application circuit in the case where there is the auxiliary circuit, and wherein the monitoring control circuit unit has an opening/closing signal selection circuit that distributes opening/closing command signals corresponding to the load driving command Son into the upper and lower opening/closing devices of the application circuit selected by the application circuit selection means.

As described above, in the load-driving integrated circuit device according to the present invention, a load-driving opening/closing device is provided in such a way as to be divided into a plurality of opening/closing devices; there is provided a plurality of opening/closing circuit units formed in such a way that two or more pairs of opening/closing circuit units that each consists of an upper-side opening/closing device and a lower-side opening/closing device are connected in parallel with one another; the opening/closing command signal for upper and lower opening/closing devices that are not selected as the application circuit by an application circuit selection means is cut off. Thus, in the case where microdust in the production process of an integrated circuit causes an initial failure or an accidental failure in part of opening/closing devices, the opening/closing device having a failure is removed from the application circuit and then is replaced by an auxiliary circuit when the failure is a disconnection abnormality, and when the failure is a snort-circuit abnormality, the opening/closing device is replaced by the auxiliary circuit after a serial opening/closing device that is the pair partner thereof has been opened. Because a simple control means makes it possible to automatically stop the portion having a failure from being utilized and to replace it by an auxiliary circuit, there is demonstrated an effect that the reliability of the integrated circuit device can remarkably be raised. In the case where no auxiliary circuit is provided but plenty of opening/closing circuit units are utilized, processing of replacement by an auxiliary circuit is not required. Moreover, there is demonstrated a secondary effect that provision of a pair of serial opening/closing devices makes it possible to simply determine in which opening/closing device a snort-circuit abnormality or a disconnection abnormality exists, without utilizing any current detection means, in comparison with a load-driving integrated circuit device in which a plurality of opening/closing devices are simply connected in parallel with one another.

The foregoing and other object, features, aspects, and advantages of the present invention will become more apparent from the following detailed description of the present invention when taken in conjunction with the accompanying drawings.

BRIEF DESCRIPTION OF THE DRAWINGS

FIG. 5A is a configuration list table of series monitoring signals, which are upstream serial signals from the monitoring control circuit unit to the calculation control circuit unit in FIG. 4;

FIG. 5B is a configuration list table of series command signals, which are downstream serial signals from the calculation control circuit unit to the monitoring control circuit unit in FIG. 4;

FIG. 5C is a configuration list table of parallel monitoring signals, which are upstream parallel signals from the monitoring control circuit unit to the calculation control circuit unit in FIG. 4;

FIG. 6 is a list table representing the states of monitoring outputs related to the opening/closing circuit units and the outside monitoring circuit unit, in FIG. 1, that are normally operating;

FIG. 7 is a list table representing the kinds of external abnormalities and the states of monitoring outputs related to the outside monitoring circuit unit in FIG. 4;

FIG. 8A is a list table representing the result of abnormality determination by the outside monitoring circuit unit, that corresponds to FIG. 7;

FIG. 8B is a list table representing the abnormality determination result corresponding to the first opening/closing circuit unit in FIG. 6;

FIG. 8C is a list table representing the abnormality determination result corresponding to the second opening/closing circuit unit in FIG. 6;

FIG. 8D is a list table representing the abnormality determination result corresponding to the third opening/closing circuit unit in FIG. 6;

DETAILED DESCRIPTION OF THE EMBODIMENTS

Detailed Explanation for Embodiment 1

(1) Detailed Description of Configuration

Figure 1:
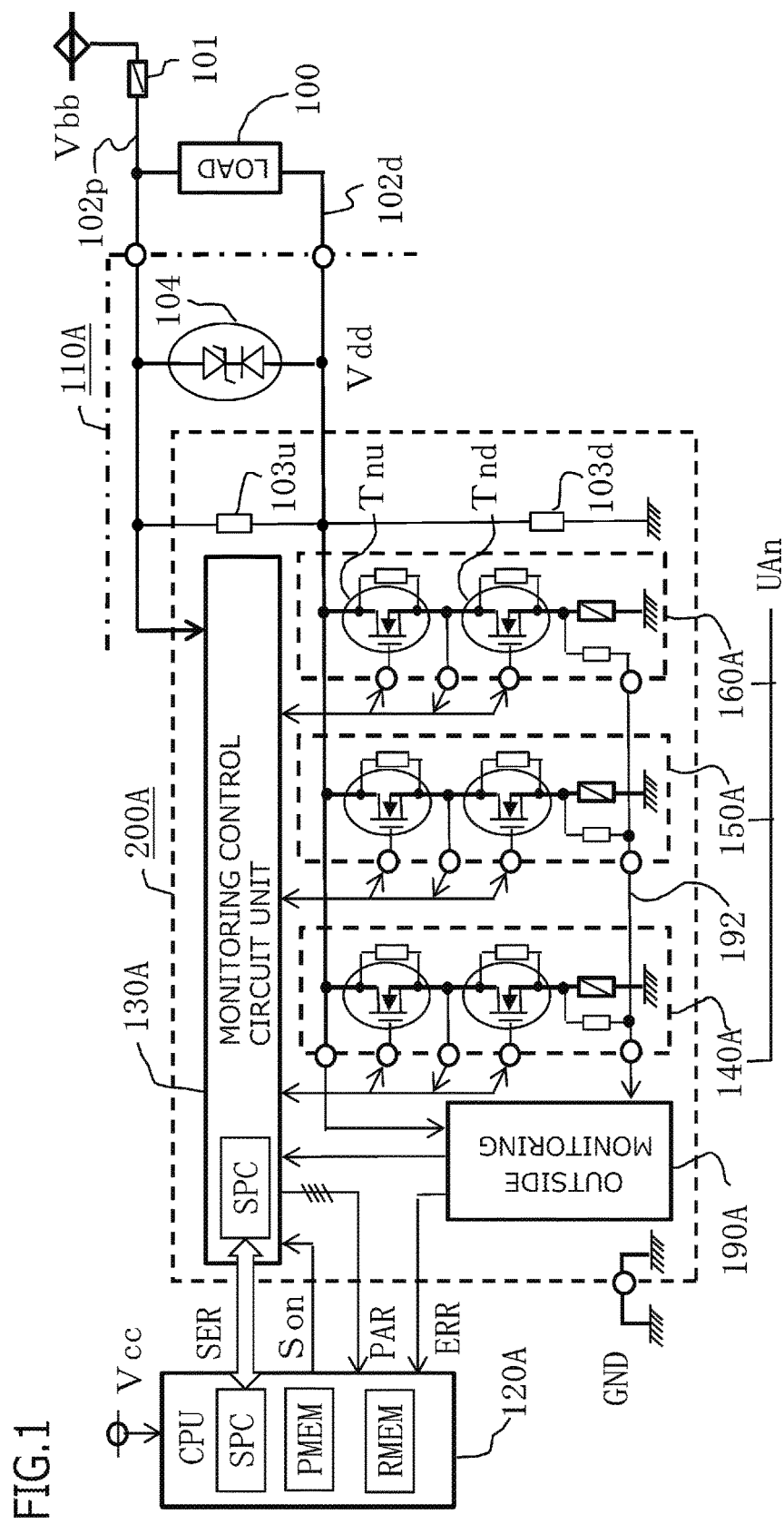
FIG. 1 is a block diagram representing the overall circuit of a load-driving integrated circuit device according to Embodiment 1 of the present invention.

Hereinafter, the configuration of Embodiment 1 will be explained in detail, with reference to FIG. 1, which is a block diagram representing the overall circuit of a load-driving integrated circuit device 110A according to Embodiment 1 of the present invention, FIG. 2, which is a detailed circuit diagram of a first opening/closing circuit unit in FIG. 1, and FIG. 3, which represents a detailed circuit diagram of an outside monitoring circuit unit in FIG. 1 and a configuration/arrangement diagram of first through third opening/closing circuit units. In FIG. 1, in an opening/closing device integrated circuit 200A, an opening/closing device unit having a plurality of semiconductor opening/closing devices, a monitoring control circuit unit 130A, and an outside monitoring circuit unit 190A are integrated on a semiconductor chip; the opening/closing device integrated circuit 200A is disposed in such a way as to collaborate with a calculation control circuit unit 120A in order to perform on/off control of the load current in an electric load 100 at a downstream position thereof. The opening/closing device unit includes a plurality of opening/closing circuit unit UAn (n=40, 50, 60, . . . ) that are connected in parallel with one another; FIG. 1 represents three opening/closing circuit units, i.e., a first opening/closing circuit unit 140A, a second opening/closing circuit unit 150A, and a third opening/closing circuit unit 160A. A power-source voltage Vbb of DC 12V, for example, from an unillustrated vehicle battery is applied to the electric load 100 by way of a power-source fuse 101 provided inside an unillustrated power-supply unit and a power-source wiring lead 102P. Through the plurality of opening/closing circuit unit UAn, described later, a negative-side load wiring lead 102d of the electric load 100 is connected with the ground circuit GND in an on/off manner.

In the case where the electric load 100 is an inductive load, a surge absorption circuit 104 is connected in parallel with the electric load 100; in the case where when the opening/closing circuit unit UAn cuts off the load current, it is desired to gently attenuate the load current, a commutation diode, as the surge absorption circuit 104, is utilized; in the case where it is desired to quickly attenuate the load current, a varistor, which becomes conductive when a voltage of, for example, several tens volts is applied thereto, is utilized. Accordingly, when a commutation diode is utilized, the cutoff voltage generated in the opening/closing circuit unit UAn is approximately the same as the power-source voltage Vbb; when a varistor is utilized, the cutoff voltage is several tens volts corresponding to the operating voltage thereof and hence the switching loss in the opening/closing circuit unit UAn becomes large. The calculation control circuit unit 120A is mounted on one and the same substrate as the opening/closing device integrated circuit 200A is; when supplied with a stabilized voltage Vcc of, for example, DC 5V by an unillustrated constant voltage power source, the calculation control circuit unit 120A operates. The calculation control circuit unit 120A mainly includes a microprocessor CPU that collaborates with a program memory PMEM and a RAM memory RMEM.

The monitoring control circuit unit 130A that forms part of the opening/closing device integrated circuit 200A performs communication of after-mentioned monitoring/control signals with the calculation control circuit unit 120A; the monitoring control circuit unit 130A is connected with the first opening/closing circuit unit 140A, the second opening/closing circuit unit 150A, and the third opening/closing circuit unit 160A, i.e., the plurality of opening/closing circuit units UAn (n=40, 50, 60, . . . ) that are connected in parallel with one another. As described in detail in FIG. 2, each of the plurality of opening/closing circuit units UAn includes upper and lower opening/closing devices, i.e., an upper-side opening/closing device Tnu and a lower-side opening/closing device Tnd that are connected in series with each other; in Embodiment 1, each of the opening/closing devices is an N-channel field effect transistor and is connected to the downstream position of the electric load 100. As described in detail in FIG. 3, the outside monitoring circuit unit 190A monitors a load wiring lead voltage Vdd, which is the ground potential of the negative-side load wiring lead 102d, so as to determine whether or not there exists a short-to-ground abnormality in which the negative-side load wiring lead 102d makes mixture contact with the ground circuit GND, whether or not there exists a short-to-power abnormality in which the negative-side load wiring lead 102d makes mixture contact with the power-source wiring lead 102P or a short-circuit abnormality in the electric load 100 itself, and whether or not there exists a load disconnection abnormality which is a disconnection of the negative-side load wiring lead 102d or an internal disconnection of the electric load 100 itself. A pull-up circuit 103u is connected between the negative-side load wiring lead 102d and the power-source wiring lead 102P; a pull-down circuit 103d is connected between the negative-side load wiring lead 102d and the ground circuit GND.

The monitoring control circuit unit 130A and the calculation control circuit unit 120A each include a serial-parallel converter SPC and mutually perform communication of a series monitoring signal to the microprocessor CPU and a series command monitoring signal SER including a series command signal from the microprocessor CPU by means of uploading communication and downloading communication, described later in FIGS. 5A and 5C; the monitoring control circuit, unit 130A directly makes a report to the microprocessor CPU by means of a 4-bit parallel monitoring signal PAR, described later in FIG. 5B. The microprocessor CPU generates a load driving command Son so as to perform opening/closing control of the upper and lower opening/closing devices in the plurality of opening/closing circuit units UAn, through the monitoring control circuit unit 130A; the microprocessor CPU preliminarily specifies to which opening/closing device an opening/closing signal is to be provided, by means of the series command signal SER. The outside monitoring circuit unit 190A generates an excessive-current detection signal ERR so as to make the monitoring control circuit unit 130A open all the opening/closing devices. Concurrently, the outside monitoring circuit unit 190A transmits the excessive-current detection signal ERR also to the microprocessor CPU; then, the microprocessor CPU stops the load driving command Son. In FIG. 1, three opening/closing circuit units are illustrated; however, in practice, it may be allowed that for example, in addition to three or four opening/closing circuit units, one auxiliary opening/closing circuit unit is included.

Figure 2:
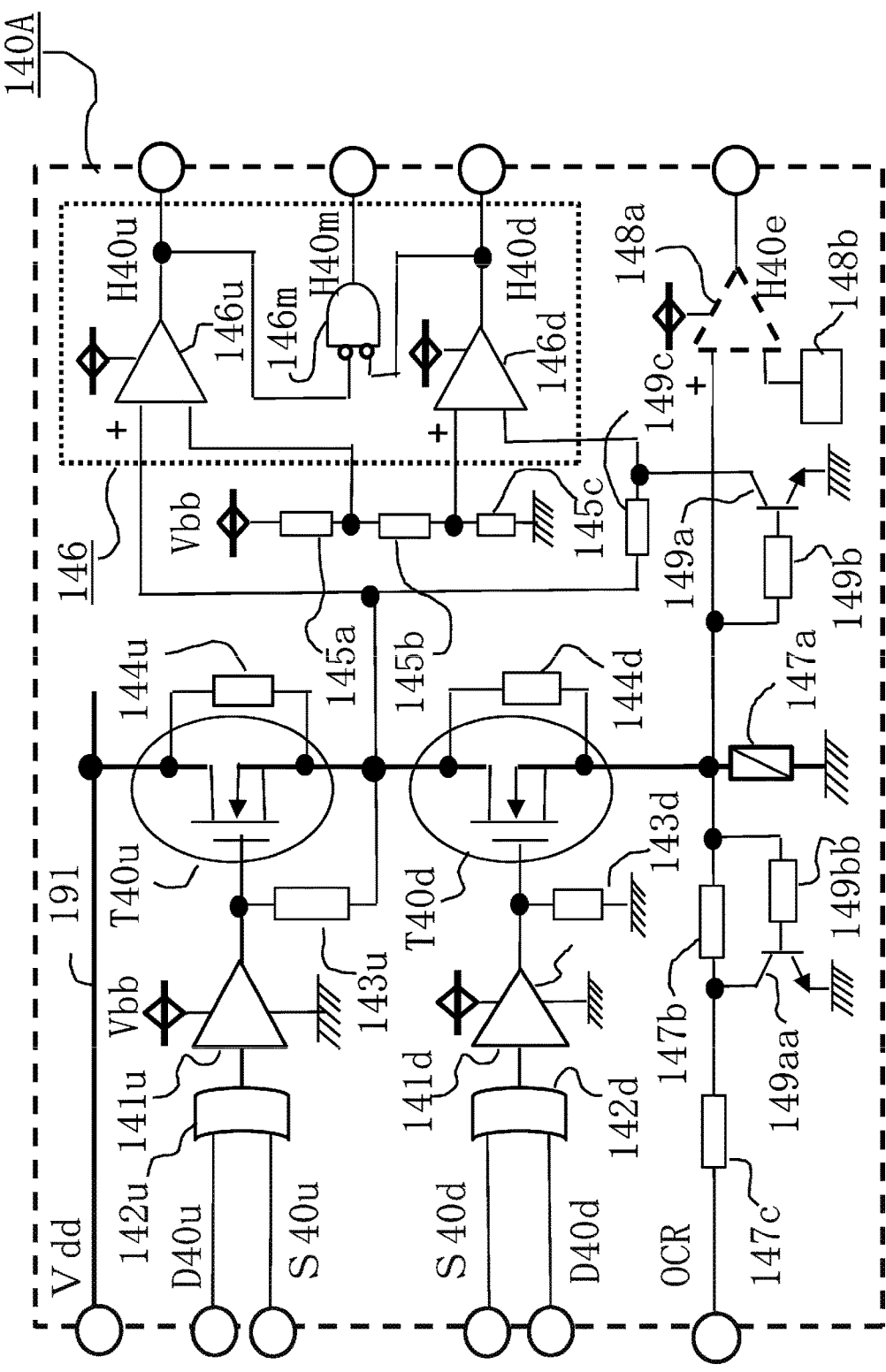
FIG. 2 is a detailed circuit diagram of a first opening/closing circuit unit in FIG. 1.

In FIG. 2, the first opening/closing circuit unit 140A is provided with a negative-side internal wiring lead 191 connected with the negative-side load wiring lead 102d, described above, and a distribution resistor 147a having a minute resistance value, an upper-side opening/closing device T40u, and a lower-side opening/closing device T40d that are connected in series with one another between the negative-side internal wiring lead 191 and the ground circuit GND; the potential of the connection point between the upper-side opening/closing device T40u and the lower-side opening/closing device T40d is detected by a connection point potential detection circuit 146. When the output logic level of an upper-side logical sum circuit 142u is "H", an upper-side circuit closing command circuit 141u performs circuit-closing driving of the upper-side opening/closing device T40u; an upper-side gate resistor 143u is connected between the gate terminal and the source terminal of the upper-side opening/closing device T40u, which is an N-channel field effect transistor; an upper-side parallel resistor 144u is connected between the drain terminal and the source terminal thereof. When the output logic level of a lower-side logical sum circuit 142d is "H", a lower-side circuit closing command circuit 141d performs circuit-closing driving of the lower-side opening/closing device T40d; a lower-side gate resistor 143d is connected between the gate terminal and the source terminal of the lower-side opening/closing device T40d, which is an N-channel field effect transistor; a lower-side parallel resistor 144d is connected between the drain terminal and the source terminal thereof.

Figure 11:
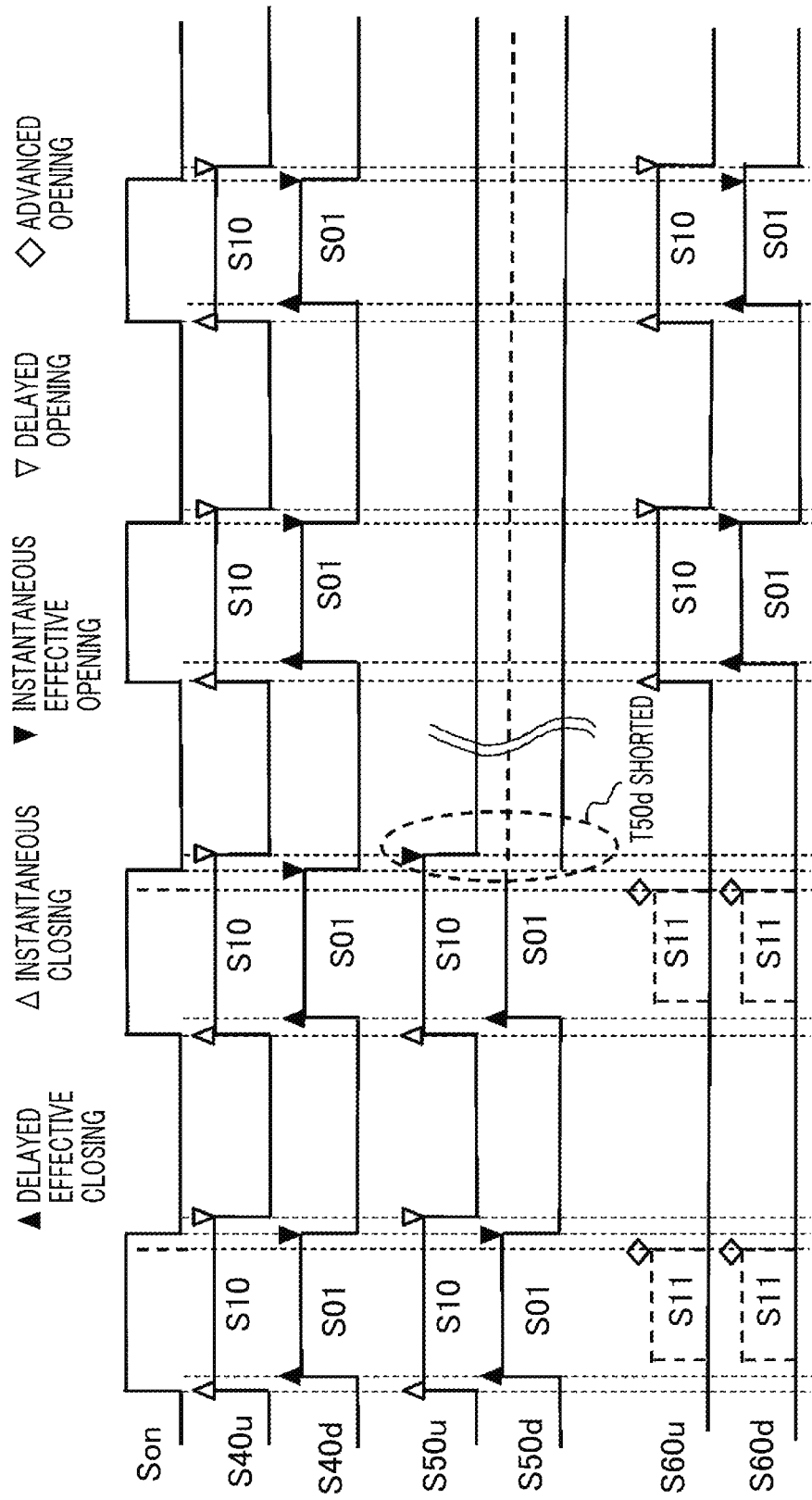
FIG. 11 is a timing chart for explaining the operation of the monitoring control circuit unit in FIG. 4.

As described later in FIG. 11, an upper-side opening/closing timing signal S40u and a lower-side opening/closing timing signal S40d to be inputted to one of the input terminals of the upper-side logical sum circuit 142u and to one of the input terminals of the lower-side logical sum circuit 142d, respectively, perform circuit-closing driving of the upper-side opening/closing device T40u and the lower-side opening/closing device T40d, respectively, which are selected for use, for all of, part of, or a prolonged part of the period in which the logic level of the load driving command Son is "H". An upper-side circuit closing specification signal D40u and a lower-side circuit closing specification signal D40d to be inputted to the other one of the input terminals of the upper-side logical sum circuit 142u and to the other one of the input terminals of the lower-side logical sum circuit 142d, respectively, are abnormality-inspection opening/closing signals that become effective when the logic level of the load driving command Son is "L" and the electric load 100 is not driven; the abnormality inspection is sequentially implemented through three separate modes, i.e., the case where both the upper-side circuit closing specification signal D40u and the lower-side circuit closing specification signal D40d are specified to be opened, the case where one of them is specified to be closed, and the case where the other one of them is specified to be closed.

An upper-side division resistor 145a, a middle division resistor 145b, and a lower-side division resistor 145c, to which the power-source voltage Vbb is applied, are connected in series with one another; the electric potential (for the sake simplicity, a potential will also be referred to only as "potential", hereinafter) of the connection point between the upper-side division resistor 145a and the middle division resistor 145b is an upper-side reference potential of, for example, 80% of the power-source voltage Vbb; the electric potential of the connection point between the middle division resistor 145b and the lower-side division resistor 145c is a lower-side reference potential of, for example, 30% of the power-source voltage Vbb. An upper-side comparison output circuit 146u compares the potential of the connection point between the upper-side opening/closing device T40u and the lower-side opening/closing device T40d (hereinafter, referred to as a monitoring potential) with the upper-side reference potential; in the case where the monitoring potential is the same as or higher than the upper-side reference potential, the upper-side comparison output circuit 146u generates a high-voltage potential level determination signal H40u having a logic level "H". A lower-side comparison output circuit 146d compares the monitoring potential with the lower-side reference potential; in the case where the monitoring potential is the same as or lower than the lower-side reference potential, the lower-side comparison output circuit 146d generates a low-voltage potential level determination signal H40d having a logic level "H". When both the respective logic levels of the high-voltage potential level determination signal H40u and the low-voltage potential level determination signal H40d are "L", a middle-voltage determination circuit 146m generates a middle-voltage potential level determination signal H40m; the connection point potential detection circuit 146 is configured with the upper-side comparison output circuit 146u, the lower-side comparison output circuit 146d, and the middle-voltage determination circuit 146m.

A current detection circuit 148a compares the voltage across a distribution resistor 147a with a current reference voltage 148b; the current detection circuit 148a generates a current detection signal H40e whose logic level becomes "H" when a current that is the same as or larger than a predetermined reference current flows in the distribution resistor 147a. The distribution resistor 147a is a wiring-lead resistor or a bonding-wire interconnection resistor whose resistance value is the same or smaller than the internal resistance of the upper-side opening/closing device T40u or the lower-side opening/closing device T40d and that has a positive temperature coefficient with which the resistance value thereof increases as the temperature rises; the distribution resistor 147a has a role of equalizing the sharing of the load current among the plurality of opening/closing circuit units UAn. The predetermined reference current is set to a current of 50% of the sharing current for a single opening/closing circuit unit at a time when all the opening/closing circuit units UAn share the rated current that is applied to the electric load 100; provided the upper-side and the lower-side opening/closing devices are in the normal closing state, the sharing current that flows in the distribution resistor 147a is the same as or larger than the reference current. Accordingly, in the case where when each of the upper-side and the lower-side opening/closing devices receives the circuit-opening command, the logic level of the current detection signal H40e is "H", it is detected that a short-circuit abnormality exists in each of the upper-side and the lower-side opening/closing devices.

Incidentally, the distribution resistor 147a has a function of a fuse that is overheated and fused when the rated current of the electric load 100 continuously flows therein. When both the upper-side and lower-side opening/closing devices are snort-circuited, the distribution resistor 147a is fused and hence the voltage thereacross increases; through a base resistor 149b, a fusing abnormality detection device 149a is closed and hence one end of an input resistor 149c connected with the negative-side input terminal of the lower-side comparison output circuit 146d is made to fall to the ground potential; as a result, both the respective logic levels of the high-voltage potential level determination signal H40u and the low-voltage potential level determination signal H40d become "H", so that the abnormality state can be detected. Therefore, in the case where the distribution resistor 147a has the overheating/fusing function, the current detection circuit 148a is not required. The upstream terminal of the distribution resistor 147a is connected with an excessive current signal wiring lead OCR by way of a prestage addition resistor 147b and a poststage addition resistor 147c and inputting is made to the outside monitoring circuit unit 190A, described later in FIG. 3. However, in the case where the distribution resistor 147a is overheated and is fused, a fusing abnormality detection device 149aa is closed through a base resistor 149bb and hence the connection point between the prestage addition resistor 147b and the poststage addition resistor 147c is made to fall to the ground potential, so that an addition signal to the outside monitoring circuit unit 190A is stopped.

Figure 3:
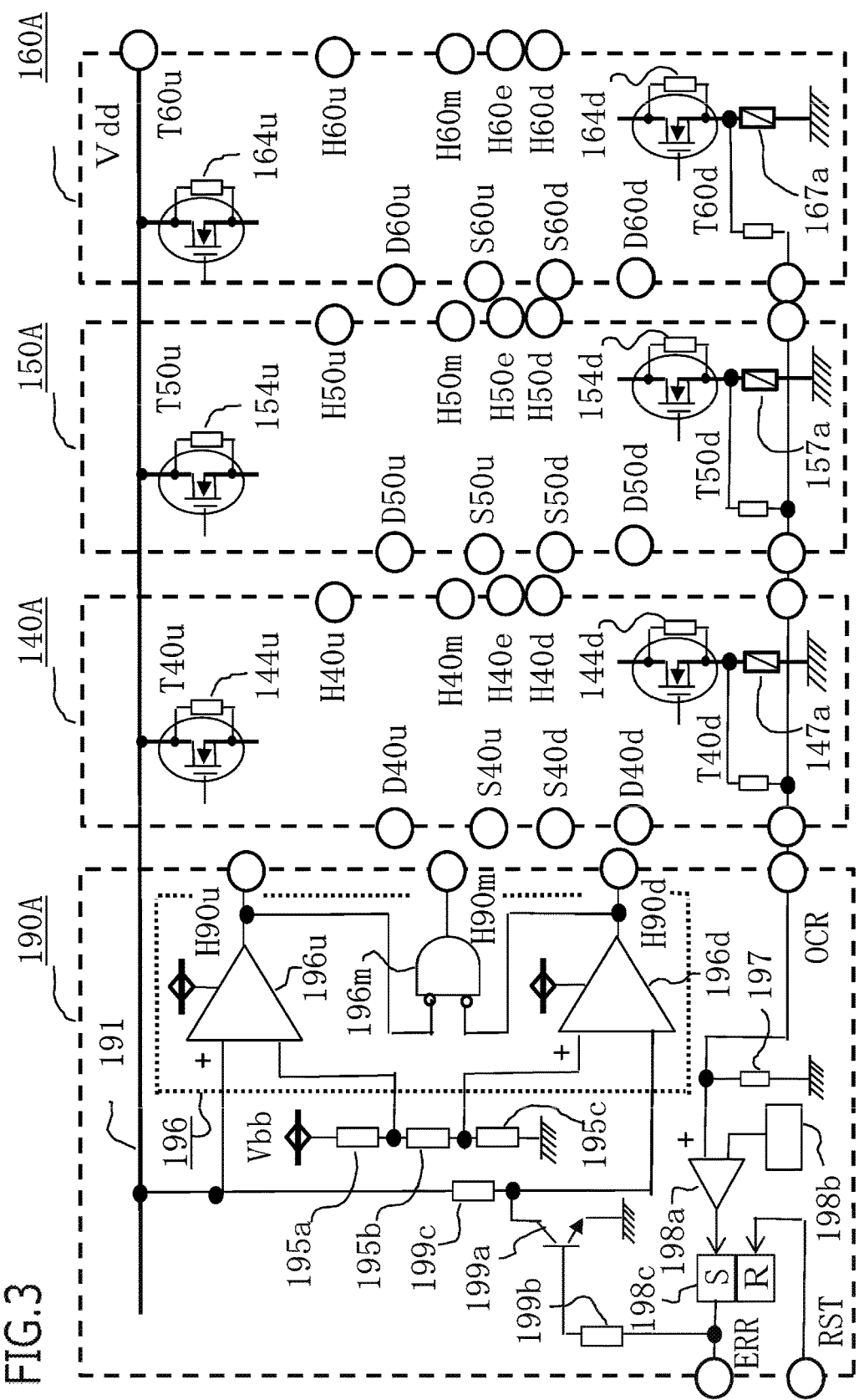
FIG. 3 represents a detailed circuit diagram of an outside monitoring circuit unit in FIG. 1 and a configuration/arrangement diagram of first through third opening/closing circuit units.

In FIG. 3, the first opening/closing circuit unit 140A, the second opening/closing circuit unit 150A, and the third opening/closing circuit unit 160A are connected with the negative-side internal wiring lead 191 leading to the negative-side load wiring lead 102d, described above in FIG. 1; each of the first opening/closing circuit unit 140A, the second opening/closing circuit unit 150A, and the third opening/closing circuit unit 160A is configured in the same manner as the first opening/closing circuit unit 140A explained in FIG. 2 is. The outside monitoring circuit unit 190A mainly includes a wiring lead potential detection circuit 196 for monitoring the potential level of the negative-side internal wiring lead 191 and an excessive-current detection circuit 198a. Firstly, an upper-side division resistor 195a, a middle division resistor 195b, and a lower-side division resistor 195c, to which the power-source voltage Vbb is applied, are connected in series with one another; the electric potential of the connection point between the upper-side division resistor 195a and the middle division resistor 195b is an upper-side reference potential of, for example, 80% of the power-source voltage Vbb; the electric potential of the connection point between the middle division resistor 195b and the lower-side division resistor 195c is a lower-side reference potential of, for example, 30% of the power-source voltage Vbb. The upper-side comparison output circuit 196u compares the monitoring potential, which is the potential level of the negative-side internal wiring lead 191, with the upper-side reference potential; in the case where the monitoring potential is the same as or higher than the upper-side reference potential, the upper-side comparison output circuit 196u generates a high-voltage potential level determination signal H90u having a logic level "H". A lower-side comparison output circuit 196d compares the monitoring potential with the lower-side reference potential; in the case where the monitoring potential is the same as or lower than the lower-side reference potential, the lower-side comparison output circuit 196d generates a low-voltage potential level determination signal H90d having a logic level "H".

When both the respective logic levels of the high-voltage potential level determination signal H90u and the low-voltage potential level determination signal H90d are "L", a middle-voltage determination circuit 196m generates a middle-voltage potential level determination signal H90m; the wiring lead potential detection circuit 196 is configured with the upper-side comparison output circuit 196u, the lower-side comparison output circuit 196d, and the middle-voltage determination circuit 196m. The excessive-current detection circuit 198a compares an excessive-current detection voltage 198b with the voltage across an addition resistor 197 connected with the poststage addition resistors 147c, 157c, and 167c (157c and 167c are unillustrated in FIG. 3) in the plurality of opening/closing circuit units UAn through the excessive current signal wiring lead OCR; the logic level of the excessive-current detection circuit 198a becomes "H" when the total value of the load currents flowing in the distribution resistors 147a, 157a, and 167a is the same as or larger than a predetermined excessive current; then, the excessive-current detection circuit 198a sets an excessive-current occurrence memory circuit 198c, which is a flip-flop circuit. The excessive-current detection circuit 198a is to detect the fact that while closing drive of the plurality of opening/closing circuit units UAn had been performed, a short-to-power abnormality in which the negative-side load wiring lead 102d makes mixture contact with the power-source wiring lead 102P or an internal short-circuiting in the electric load 100 has occurred; the predetermined excessive current, which is a comparison determination reference, is set to a current that is larger than the rated current of the electric load 100 but smaller than the fusing capacity of the power-source fuse 101.

The set output of the excessive-current occurrence memory circuit 198c, as the excessive-current detection signal ERR, is transmitted to the microprocessor CPU; then, the microprocessor CPU stops the load driving command Son and generates a reset command RST so as to reset the excessive-current occurrence memory circuit 198c. When the excessive-current detection signal ERR is generated, an excessive current abnormality detection device 199a is closed through a base resistor 199b and hence one end of an input resistor 199c connected with the negative-side input terminal of the lower-side comparison output circuit 196d is made to fall to the ground potential. As a result, both the respective logic levels of the high-voltage potential level determination signal H90u and the low-voltage potential level determination signal H90d become "H", so that the abnormality state can be detected.

Figure 4:
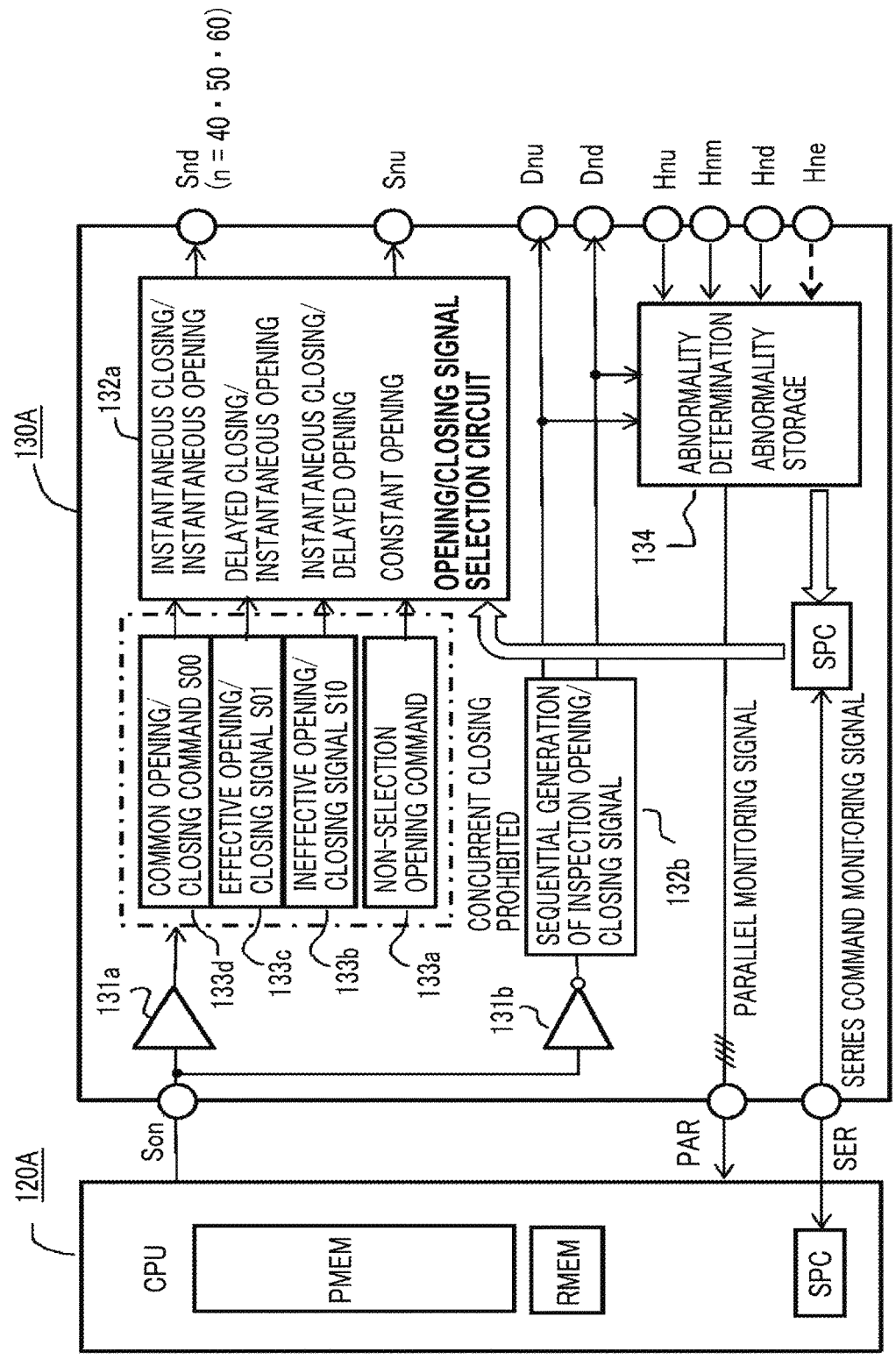
FIG. 4 represents a block diagram of the overall circuit of a monitoring control circuit unit in FIG. 1 and a configuration diagram of connection between the monitoring control circuit unit and a calculation control circuit unit.

Next, with regard to the block diagram of the overall circuit of the monitoring control circuit unit in FIG. 1 and FIG. 4, which is a configuration diagram of the connection between the monitoring control circuit unit and the calculation control circuit unit, the configuration will be explained in detail. In FIG. 4, it is represented that when the logic level of the load driving command Son generated by the microprocessor CPU is "H", the circuit blocks 133a through 133d and 132a that respond to the output of a buffer device 131a operate; when the logic level of the load driving command Son is "L", the circuit blocks 132b and 134 that respond to the output of an inverting device 131b operate. A non-selection opening command 133a generates a circuit-opening command signal for the upper and lower opening/closing devices to be applied to a non-selection circuit (an auxiliary circuit unit or an abnormality occurrence circuit unit). As represented in FIG. 11, an ineffective on/off command circuit 133b generates an ineffective opening/closing signal S10 that immediately becomes a circuit-closing command when the load driving command Son becomes a circuit-closing command and that waits the time for the partner opening/closing device to cut off the load current, when the load driving command Son becomes a circuit-opening command, and then becomes an circuit-opening command in a delayed manner. An effective on/off command circuit 133c generates an effective opening/closing signal S01 that waits the time for the partner opening/closing device to complete the closing operation, when the load driving command Son becomes a circuit-closing command, and then becomes a circuit-closing command in a delayed manner, thereby making the load current start to flow and that immediately becomes a circuit-opening command when the load driving command Son becomes a circuit-opening command, thereby cutting off the load current. Thus, the effective opening/closing signal S01 makes the on/off operation of the load current performed, and the ineffective opening/closing signal S10 does not make the on/off operation of the load current performed.

A common opening/closing command 133d generates a common opening/closing signal S00 that immediately becomes a circuit-closing command when the load driving command Son becomes a circuit-closing command and immediately becomes circuit-opening command when the load driving command Son becomes a circuit-opening command, thereby opening or closing the upper and lower opening/closing devices in conjunction with the operation of the load driving command Son. Based on the downstream series command signal SER, described later in FIG. 5B, from the microprocessor CPU, an opening/closing signal selection circuit 132a determines the type of a command signal to be provided to each of the upper-side opening/closing timing signal Snu and the lower-side opening/closing timing signal Snd. In the case where one of the upper and lower serial opening/closing devices is immediately closed and then is opened in a delayed manner and the other one of the upper and lower serial opening/closing devices is closed in a delayed manner and then is immediately opened, the on/off operation of the load current is performed only by the other opening/closing device; thus, the one opening/closing device does not contribute to the on/off operation. Accordingly, a switching loss occurs in the opening/closing device to which the effective opening/closing signal S01 is provided; however, in the opening/closing device to which the ineffective opening/closing signal S10 is provided, the switching loss does not occur but is preserved. In contrast, in the case where the common opening/closing signal S00 is utilized, the upper and lower opening/closing devices concurrently perform the on/off operation of the load current; thus, because although the switching loss is shared, the sharing degrees are not equal, variation occurs in the amount of the switching loss.

An inspection signal generation circuit 132b sequentially generates the opening/closing command signal in each of a first mode (Dnu="L", Dnd="L"), a second mode (Dnu="L", Dnd="H"), and a third mode (Dnu="H", Dnd="L"), as the combination of the upper-side circuit closing specification signal Dnu for the upper-side opening/closing device Tnu and the lower-side circuit closing specification signal Dnd for the lower-side opening/closing device Tnd. In accordance with the combination of the logic levels of the circuit closing specification signals Dnu and Dnd provided to the upper and lower opening/closing devices and the logic levels of the monitoring signals including the three kinds of potential level determination signals Hnu, Hnm, and Hnd or the current detection signal Hne, an abnormality determination processing unit 134 determines whether or not an abnormality exists in each of the units, based on truth tables represented in FIGS. 8A through 8D; the abnormality determination processing unit 134 transmits the determination result to the microprocessor CPU, by means of the upstream series monitoring signal SER represented in FIG. 5A and the upstream parallel monitoring signal PAR represented in FIG. 5C.

Next, there will be explained FIG. 5A that is a configuration list table of the series monitoring signals SER, which are upstream serial signals from the monitoring control circuit unit to the calculation control circuit unit in FIG. 4, FIG. 5B that is a configuration list table of the series command signals SER, which are downstream serial signals from the calculation control circuit unit to the monitoring control circuit unit, and FIG. 5C that is a configuration list table of the parallel monitoring signals PAR, which are upstream parallel signals from the monitoring control circuit unit to the calculation control circuit unit. In FIG. 5A, the bits b0 through b11 of the upstream serial signal specify the normality classification and the abnormality classification for the upper and lower opening/closing devices in the first, second, and third opening/closing circuit units 140A, 150A, and 160A; in the case where an abnormality exists, the classification of a short-circuit abnormality or a disconnection abnormality is specified. The bits b12 through b15 indicate whether each of the opening/closing circuit units is selectively applied or is not operated. For example, in the case where b0=0, b1=1, b2=0, and b3=0, it is indicated that a disconnection exists in the upper-side opening/closing device T40u but the lower-side opening/closing device T40d is normal; in the case where b12=0, it is indicated that the first opening/closing circuit unit 140A is in an unapplied and stopped state. The larger the total number of opening/closing circuit units is, the larger the number of the bits of the serial signal becomes; however, the case where the total number is 3 is explained herein.

FIG. 5B represents respective 2-bit selection command signals that are transmitted downstream to the first, second, and third opening/closing circuit units 140A, 150A, and 160A. The signal including the bits b0 and b1 is a selection command signal for the first opening/closing circuit unit 140A; the signal including the bits b2 and b3 is a selection command signal for the second opening/closing circuit unit 150A; the signal including the bits b4 and b5 is a selection command signal for the third opening/closing circuit unit 160A. The bits b0 and b1, the bits b2 and b3, or the bits b4 and b5 indicate that the subject thereof is the lower-side opening/closing timing signal Snd or the upper-side opening/closing timing signal Snu for the first, second, and third opening/closing circuit units. For example, when the logics of the bit b0 (or b2, b4) and the bit b1 (or b3, b5) for the application classification A are "0", each of the lower-side opening/closing timing signal S40d (or S50d, S60d) and the upper-side opening/closing timing signal S40u (or S50u, S60u) becomes a circuit-opening command signal; when the logics of the bit b0 (or b2, b4) and the bit b1 (or b3, b5) for the application classification B are "1" and "0", respectively, the lower-side opening/closing timing signal S40d (or S50d, S60d) becomes a command for selecting the effective opening/closing signal S01 and the upper-side opening/closing timing signal S40u (or S50u, S60u) becomes a command for selecting the ineffective opening/closing signal S10; when the logics of the bit b0 (or b2, b4) and the bit b1 (or b3, b5) for the application classification C are "0" and "1", respectively, the lower-side opening/closing timing signal S40d (or S50d, S60d) becomes a command for selecting the ineffective opening/closing signal S10 and the upper-side opening/closing timing signal S40u (or S50u, S60u) becomes a command for selecting the effective opening/closing signal S01. When the logics of the bit b0 (or b2, b4) and the bit b1 (or b3, b5) for the application classification D are "1", each of the lower-side opening/closing timing signal S40d (or S50d, S60d) and the upper-side opening/closing timing signal S40u (or S50u, S60u) becomes a command for selecting the common opening/closing signal S00.

In FIG. 5C, as the result of an outside diagnosis by the outside monitoring circuit unit 190A, the bits b0, b1, and b2 of the parallel monitoring signal PAR indicate whether or not a short-to-ground abnormality, a short-to-power abnormality, or a disconnection abnormality exists in the negative-side load wiring lead 102d; it is indicated that in the case where the logic of the bit b3 is "0", all the plurality of opening/closing circuit units UAn are normal and that in the case where the logic of the bit b3 is "1", one of the plurality of opening/closing circuit units UAn is abnormal. The monitoring control circuit unit 130A keeps the logics of the bits b0 through b3 to be "1" until the initial inspection of all the opening/closing circuit units by the inspection signal generation circuit 132b and the abnormality determination processing unit 134 is completed. The downstream serial signal can be transmitted any time by the microprocessor CPU; the upstream serial signal is returned in response to the transmission request from the microprocessor CPU. However, the parallel upstream signal can be transmitted any time without the transmission request from the microprocessor CPU and can be monitored any time by the microprocessor CPU; when recognizing the occurrence of an abnormality by means of the parallel upstream signal, the microprocessor CPU transmits the transmission request by means of the upstream serial signal, so that "in which opening/closing circuit unit the abnormality has occurred" can be recognized.

(2) Detailed Description of Operation and Action

Hereinafter, in the load-driving integrated circuit device 110A, according to Embodiment 1 of the present invention, that is configured as represented in FIG. 1, there will be explained in detail FIG. 6 representing the states of monitoring outputs related to the opening/closing circuit units and the outside monitoring circuit unit that are normally operating, FIG. 7 representing the kinds of external abnormalities and the state of the monitoring output related to the outside monitoring circuit unit, FIG. 8A that is a list table representing the result of the abnormality determination by the outside monitoring circuit unit, and FIGS. 8B through 8D that are list tables of the respective results of the abnormality determinations by the first through third opening/closing circuit units. Firstly, in FIG. 1, when an unillustrated power switch is closed, the output contact of an unillustrated main power source relay is closed and hence an unillustrated constant voltage power source circuit generates a stabilized voltage Vcc, so that the microprocessor CPU, which is the main element in the calculation control circuit unit 120A, starts control operation. As a result, an unillustrated load power source relay is energized and hence the electric load 100 is supplied with the power-source voltage Vbb. In response to the operation state of an unillustrated group of sensors and the contents of the control program, stored in the nonvolatile program memory PMEM, the microprocessor CPU generates the load driving command Son so as to perform on/off control of the load current for the electric load 100.

The outline of the monitoring control operation of the opening/closing device integrated circuit 200A, described later in detail, is as follows:

The monitoring control circuit unit 130A and the plurality of opening/closing circuit units UAn included in the opening/closing device integrated circuit 200A determine whether or not a disconnection abnormality or a short-circuit abnormality exists in the upper-side opening/closing device Tnu and the lower-side opening/closing device Tnd provided in each of the opening/closing circuit units, and report the determination result to the calculation control circuit unit 120A (device abnormality determination). The calculation control circuit unit 120A has an application circuit selection means that, for example, does not utilize the opening/closing circuit unit in which an abnormality has occurred and replaces the opening/closing circuit unit by an auxiliary circuit (application circuit selection). The monitoring control circuit unit 130A has the opening/closing signal selection circuit and distributes the opening/closing signals to the opening/closing circuit units that are selected as the application circuits (opening/closing signal distribution). The kinds of opening/closing signals include the common opening/closing signal S00 for concurrently opening/closing the upper and lower opening/closing devices in conjunction with the logic operation of the load driving command Son, the effective opening/closing signal S01 for closing in a delayed manner and then opening instantaneously, the ineffective opening/closing signal S10 for closing instantaneously and then opening in a delayed manner, and the like. The outside monitoring circuit unit 190A monitors whether or not a short-to-power abnormality, a short-to-ground abnormality, a short-circuit abnormality, or a disconnection abnormality exists in the load wiring lead and then reports abnormality occurrence information to the calculation control circuit unit 120A (external abnormality diagnosis).

In FIG. 6, the list table represents the respective opening/closing states, of the lower-side opening/closing device Tnd and the upper-side opening/closing device Tnu, that correspond to the logic level of the lower-side circuit closing specification signal Dnd (n=40, 50, 60; the same applies hereinafter) and the logic level of the upper-side circuit closing specification signal Dnu at a time when the first opening/closing circuit unit 140A is an application circuit 1 for performing driving, the second opening/closing circuit unit 150A is an application circuit 2 for performing driving, and the third opening/closing circuit unit 160A is an auxiliary circuit that does not perform driving; for example, when D40u=H, T40u is closed, and when D40u=L, T40u is opened. The same applies to the other opening/closing devices; when Dnu=H, Tnu is closed, and when Dnu=L, Tnu is opened. As represented in the upper portion of FIG. 6, when both the upper and lower opening/closing devices Tnu and Tnd are closed, the potential of the connection point therebetween becomes the ground level; thus, the logic of the low-voltage potential level determination signal Hnd becomes "H"; then, the logic levels of the other determination signals Hnm and Hnu become "L" and the logic level of the current detection signal Hne becomes "H". However, as represented in the lower portion of FIG. 6, when both the upper and lower opening/closing devices Tnu and Tnd are opened, the potential of the connection point therebetween becomes the middle level; thus, the logic of the middle-voltage potential level determination signal Hnm becomes "H"; then, the logic levels of the other determination signals Hnd and Hnu become "L" and the logic level of the current detection signal Hne becomes "L".

In contrast, when both the upper and lower opening/closing devices Tnu and Tnd are closed and hence the electric load 100 is normally driven, the potential of the negative-side load wiring lead 102d is the ground level; thus, only the logic of the low-voltage potential level determination signal H90d among the potential level determination signals H90d, H90m, and H90u of the outside monitoring circuit unit 190A becomes "H" and the logics of the other determination signals H90u and H90m are "L". Similarly, when both the upper and lower opening/closing devices Tnu and Tnd are opened and hence the electric load 100 is not driven, the potential of the negative-side load wiring lead 102d is the level of the power-source voltage; thus, only the logic of the high-voltage potential level determination signal H90u among the potential level determination signals H90d, H90m, and H90u of the outside monitoring circuit unit 190A becomes "H" and the logics of the other determination signals H90m and H90d are "L".

In FIG. 7, in a normal situation, the logic level of the high-voltage potential level determination signal H90u of the outside monitoring circuit unit 190A becomes "H" when both the upper and lower opening/closing devices Tnu and Tnd are opened and hence the electric load 100 is in the normal n on-driven state; however, when a short-to-power abnormality occurs in the negative-side load wiring lead 102d, the logic level of the high-voltage potential level determination signal H90u becomes "H" even when the electric load 100 is either driven or not driven and hence abnormality detection can be performed. In general, the logic level of the middle-voltage potential level determination signal H90m of the outside monitoring circuit unit 190A never becomes "H"; however, in the case where while both the upper and lower opening/closing devices Tnu and Tnd are opened and hence the electric load 100 is not driven, a load disconnection abnormality occurs, the logic level of the middle-voltage potential level determination signal H90m becomes "H" and hence abnormality detection can be performed. When the electric load 100 is not driven, the logic level of the low-voltage potential level determination signal H90d of the outside monitoring circuit unit 190A becomes "L", in general; however, when a short-to-ground abnormality occurs in the negative-side load wiring lead 102d, the logic level of the low-voltage potential level determination signal H90d becomes "H" and hence abnormality detection can be performed. In this regard, however, the distinction between a short-circuit abnormality in the upper and lower opening/closing devices and a short-to-ground abnormality in the negative-side load wiring lead 102d is performed based on the logic state of the current detection signal Hne; when a short-circuit abnormality occurs in the upper and lower opening/closing devices, the logic of the current detection signal Hne is "H".

In FIG. 8A, an abnormality in the negative-side load wiring lead 102d or the electric load 100 is detected in the following manner. Firstly, in the case where the electric load 100 is not driven and at least one of the upper and lower opening/closing devices Tnu and Tnd is opened, the logic level of the middle-voltage potential level determination signal H90m becomes "H" when the load is disconnected, and the logic level of the low-voltage potential level determination signal H90d becomes "H" when a short-to-ground abnormality occurs in the negative-side load wiring lead 102d. In the case where when the electric load 100 is driven and both the upper and lower opening/closing devices Tnu and Tnd are closed, a short-to-power abnormality occurs in the negative-side load wiring lead 102d, the excessive-current detection signal ERR is generated and hence this abnormality is detected.

In FIGS. 8B through 8D, whether or not a short-circuit abnormality or a disconnection abnormality exists in the upper-side opening/closing device Tnu and/or the lower-side opening/closing device Tnd is determined in the following manner. Firstly, in the case where when the circuit-opening command is provided to each of the upper and lower opening/closing devices Tnu and Tnd, the logic level of the high-voltage potential level determination signal Hnu is "H", a short-circuit abnormality exists in the upper-side opening/closing device Tnu; in the case where the logic level of the low-voltage potential level determination signal Hnd is "H", a snort-circuit abnormality exists in the lower-side opening/closing device Tnd. In the case where when the circuit-closing command is provided only to the lower-side opening/closing device Tnd, the logic level of the middle-voltage potential level determination signal Hnm is "H", a disconnection abnormality exists in the lower-side opening/closing device Tnd; in the case where when the circuit-closing command is provided only to the upper-side opening/closing device Tnu, the logic level of the middle-voltage potential level determination signal Hnm is "H", a disconnection abnormality exists in the upper-side opening/closing device Tnu.

In the case where when the circuit-closing command is provided to each of the upper and lower opening/closing devices Tnu and Tnd, the logic level of the high-voltage potential level determination signal Hnu is "H", a disconnection abnormality exists in the lower-side opening/closing device Tnd; in the case where the logic level of the middle-voltage potential level determination signal Hnm is "H", a disconnection abnormality exists in each of the upper and lower opening/closing devices; in the case where the logic level of the low-voltage potential level determination signal Hnd is "H", both the upper and lower opening/closing devices are normal. In the case where when the current detection signal Hne is provided, a short-circuit abnormality exists in each of the upper and lower opening/closing devices Tnu and Tnd, the logic level of the current detection signal Hne becomes "H" and hence the abnormality can be detected. When any one of the distribution resistors 147a, 157a, an 167a is fused, both the respective logic levels of the high-voltage and low-voltage potential level determination signals Hnu and Hnd of the opening/closing circuit unit in which any one of the distribution resistors 147a, 157a, an 167a has been fused become "H"; thus, the fusing can be detected.

Figure 9A:
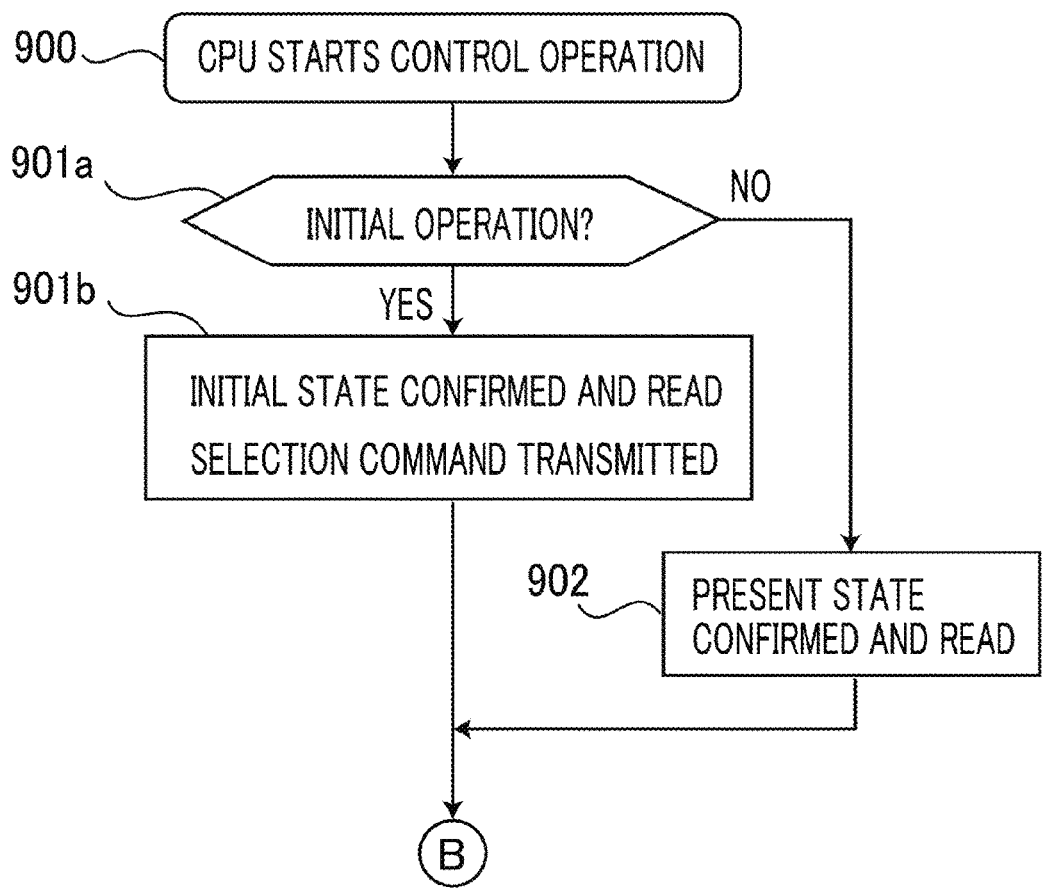
FIG. 9A is the former stage portion of a flowchart for explaining the operation of the calculation control circuit unit in FIG. 1.

Next, FIGS. 9A, 9B, and 9C, which are the former stage portion, the middle stage portion, and the latter stage portion, respectively, of a flowchart for explaining the operation of the calculation control circuit unit in FIG. 1, will be explained in detail. In FIG. 9A, the process 900 is an operation starting process of the microprocessor CPU. In the process 901a, which is a determination step, it is determined whether or not the present process is the initial passing process; in the case where the present process is the initial passing process, the result of the determination becomes "YES", and the process 901a is followed by the process 901b; in the case where the present process is not the initial passing process, the result of the determination becomes "NO", and the process 901a is followed by the process 902. The process 901a is a step in which the load driving command Son is stopped (the logic level thereof is made "L") and the result of a simultaneous inspection by the monitoring control circuit unit 130A is read by means of the parallel monitoring signal PAR and the series monitoring signal SER, and then the selection command signal is transmitted by means of the series command signal SER. The process 902 is a step in which the parallel monitoring signal PAR represented in FIG. 5C is read and, as may be necessary, the detailed information represented in FIG. 5A is read; the process 911 in FIG. 9B follows the process 901b or the process 902 by way of the relay terminal B.

Figure 9B:
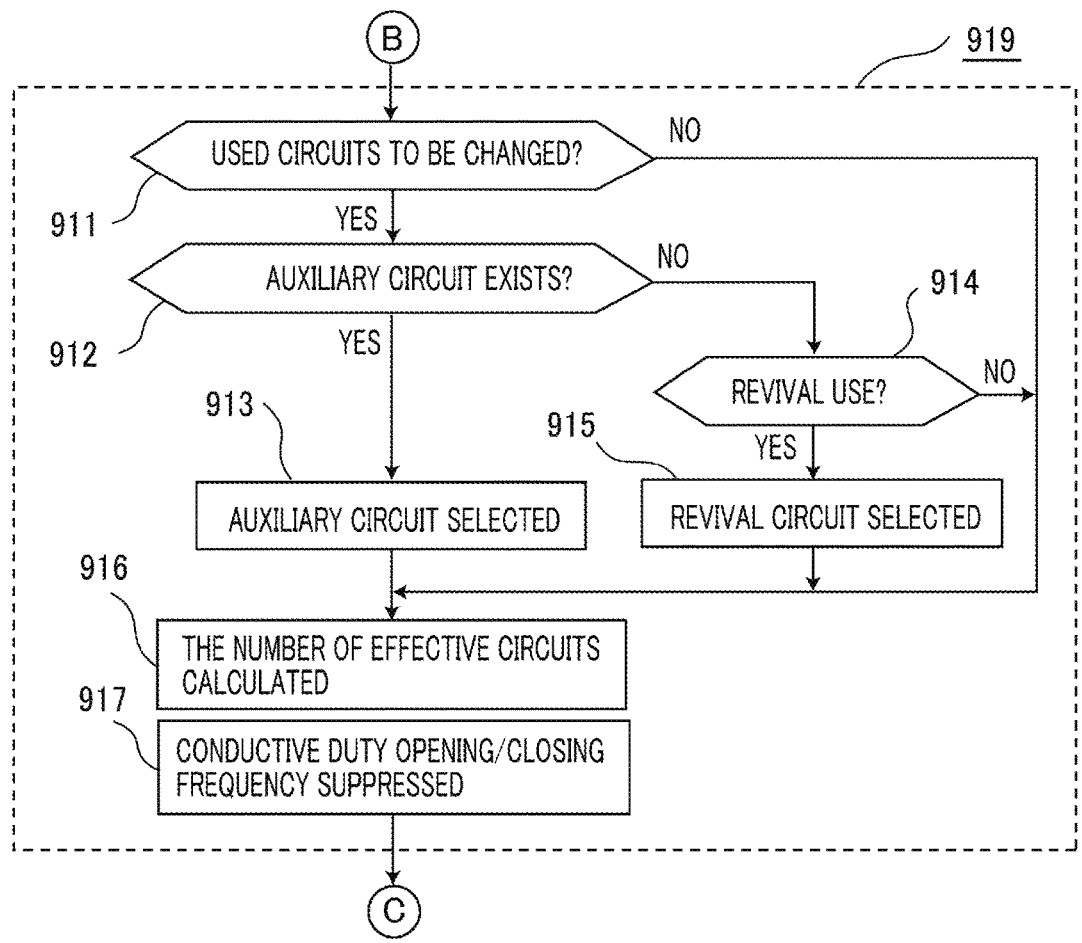
FIG. 9B is the middle stage portion of the flowchart for explaining the operation of the calculation control circuit unit in FIG. 1.

In FIG. 9B, in the process 911, which is a determination step, in the case where in response to the state, of the opening/closing device integrated circuit 200A, that has been read in the process 911 or the process 902, the application circuit is changed, the result of the determination becomes "YES" and then the process 911 is followed by the process 912; in the case where the application circuit is not changed, the result of the determination becomes "NO" and then the process 911 is followed by the process 916. In the process 912, which is a determination step, in the case where there exists an auxiliary circuit, the result of the determination becomes "YES", then the process 912 is followed by the process 913; in the case where there exists no auxiliary circuit, the result of the determination becomes "NO", then the process 912 is followed by the process 914. In the process 913, the kinds of the opening/closing signals for the lower-side opening/closing timing signal Snd and the upper-side opening/closing timing signal Snu are specified by means of the series command signal SER represented in FIG. 5B; then, the process 913 is followed by the process 916. In the process 914, which is a determination step, it is determined whether or not the partially broken opening/closing circuit unit in which one of the upper and lower opening/closing devices is short-circuited and the other one thereof is normal should be utilized, as the application circuit, in a revival manner; in the case where the partially broken opening/closing circuit unit is utilized in a revival manner, the result of the determination becomes "YES" and then the process 914 is followed by the process 915; in the case where the partially broken opening/closing circuit unit is not utilized in a revival manner, the result of the determination becomes "NO" and then the process 914 is followed by the process 916. In the process 915, the kinds of the opening/closing signals for the lower-side opening/closing timing signal Snd and the upper-side opening/closing timing signal Snu of the partially broken opening/closing circuit unit that is utilized in a revival manner are specified by means of the series command signal SER represented in FIG. 5B; then, the process 915 is followed by the process 916. The process 916 is a step in which the number of the effective opening/closing circuit units that are currently utilized is calculated and that is followed by the process 917.

Figure 9C:
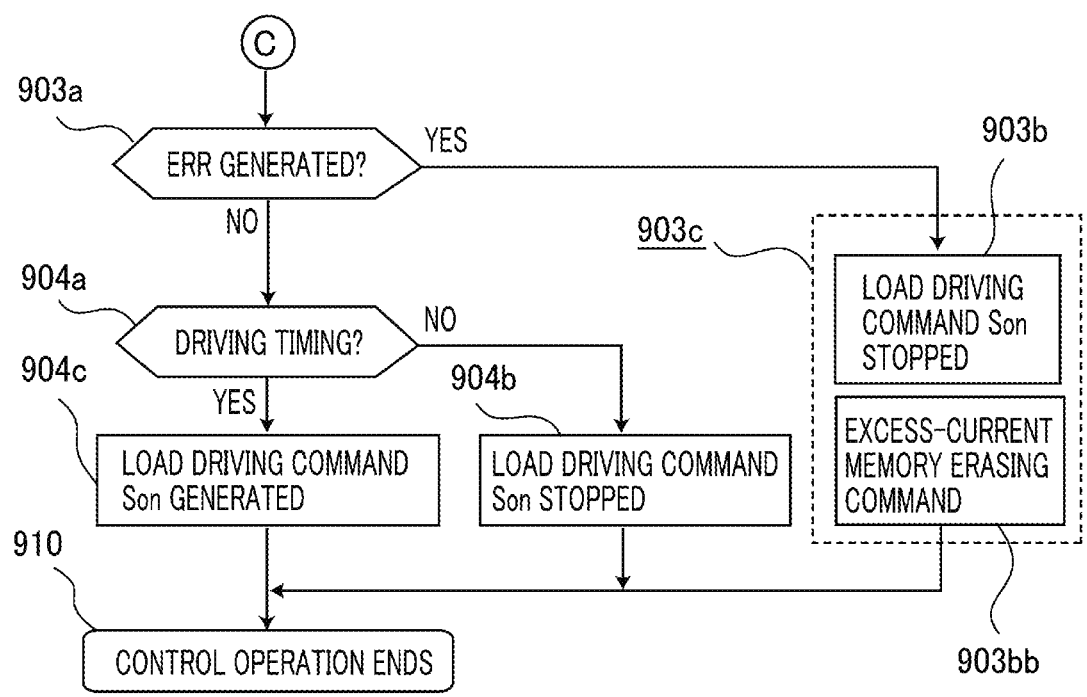
FIG. 9C is the latter stage portion of the flowchart for explaining the operation of the calculation control circuit unit in FIG. 1.

The process 917 is a step in which when the number of utilized opening/closing circuit units is smaller than an appropriate number, the conduction duty rate of the load driving command Son is suppressed or the on/off frequency of the load driving command Son is suppressed and that is followed by the process 903a in FIG. 9C by way of the relay terminal C. The process block 919 including processes 911 through 917 is the application circuit selection means; the process 913 is an auxiliary circuit selection means, the process 915 is a revival circuit selection means; the process 917 is a conduction suppression means; each of the revival circuit selection means 915 and the conduction suppression means 917 is utilized as an emergency operation means in an abnormal situation.

In FIG. 9C, in the process 903a, which is a determination step, it is determined whether or not the excessive-current detection signal ERR, which is an interruption signal generated by the outside monitoring circuit unit 190A, has occurred; in the case where the excessive-current detection signal ERR has been received, the result of the determination becomes "YES" and the process 903a is followed by the process 903b; in the case where the excessive-current detection signal ERR has not been received, the result of the determination becomes "NO" and the process 903a is followed by the process 904a. In the process 903b, the load driving command Son is stopped, and in the process 903bb, the reset command RST is generated so that the excessive-current occurrence memory circuit 198c in the outside monitoring circuit unit 190A is reset; then, the process 903bb is followed by the operation ending process 910. The process block 903c including the process 903b and the process 903bb is an abnormality occurrence processing means. In the process 904a, in response to the operation state of an unillustrated outside sensor or the like, it is determined whether or not the present timing is the timing for generating the load driving command Son; in the case where the present timing is not the timing for generating the load driving command Son, the result of the determination becomes "NO" and the process 904a is followed by the process 904b, where the logic level of the load driving command Son is made "L"; in the case where the present timing is the timing for generating the load driving command Son, the result of the determination becomes "YES" and the process 904a is followed by the process 904c, where the logic level of the load driving command Son is made "H"; then, the process 904c is followed by the operation ending process 910. In the operation ending process 910, other control programs are implemented and then, the operation starting process 900 is resumed within a predetermined time period; the following control programs are implemented in a repeated manner.

Figure 10:
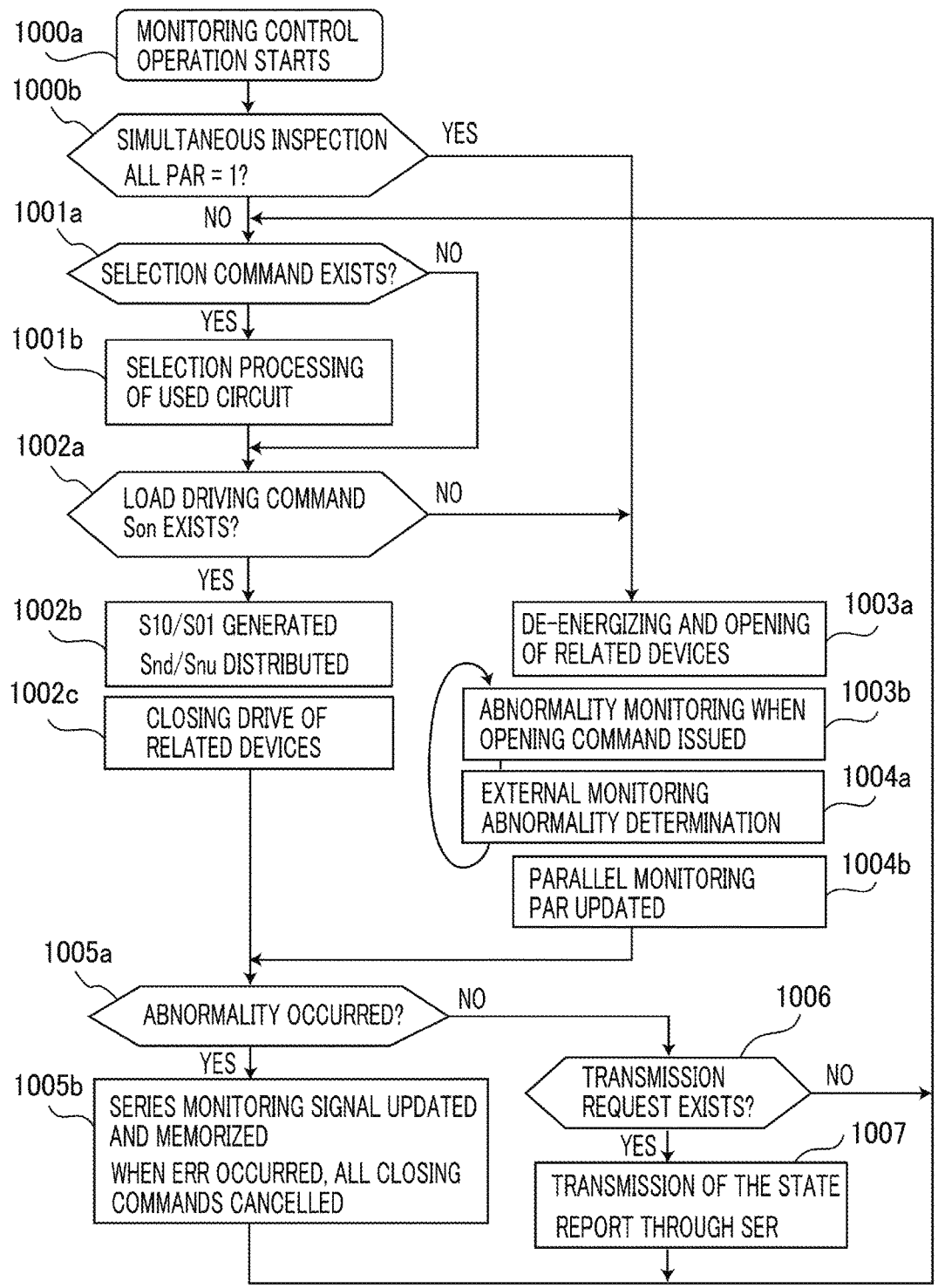
FIG. 10 is a flowchart for explaining the operation of the monitoring control circuit unit in FIG. 4.

Next, FIG. 10, which is a flowchart for explaining the operation of the monitoring control circuit unit in FIG. 4, will be explained in detail. The monitoring control circuit unit 130A is formed of a logic circuit that does not include a microprocessor; the flowchart explained hereinafter represents the action and operation of the logic circuit in an equivalent manner. In FIG. 10, the process 1000a is a step in which when the power-source voltage Vbb is applied to the opening/closing device integrated circuit 200A, the monitoring control circuit unit 130A starts its operation; the parallel monitoring signal PAR at a time of operation start is in the initial state in which the logics of all the bits b0 through b3 thereof are "1". In the process 1000b, which is a determination step, in the case where the parallel monitoring signal PAR is in the initial state, the result of the determination becomes "YES" and the process 1000b is followed by the process 1003a; in the case where the parallel monitoring signal PAR is not in the initial state, the result of the determination becomes "NO" and the process 1000b is followed by the process 1001a.

In the process 1003a, it is confirmed that the load driving command Son is the circuit-opening command; then, the process 1003a is followed by the process 1003b. In the process 1003b, while the inspection signal generation circuit 132b in FIG. 4 generates, firstly, the upper-side circuit closing specification signal D40u and the lower-side circuit closing specification signal D40d related to the first opening/closing circuit unit 140A with three sequential modes (L, L), (L, H), and (H, L), secondly, the upper-side circuit closing specification signal D50u and the lower-side circuit closing specification signal D50d related to the second opening/closing circuit unit 150A with three sequential modes (L, L), (L, H), and (H, L), and thirdly, the upper-side circuit closing specification signal D60u and the lower-side circuit closing specification signal D60d related to the third opening/closing circuit unit 160A with three sequential modes (L, L), (L, H), and (H, L), the abnormality determination processing unit 134 in FIG. 4 compares the respective generated modes with the potential level determination signals Hnu, Hnm, and Hnd, as represented in FIGS. 8B through 8D, and determines whether or not there exists a disconnection abnormality or a short-circuit abnormality in the upper-side and lower-side opening/closing devices Tnu and Tnd; the process 1003b is sequentially followed by the process 1004a. In the process 1004a, as represented in FIG. 8A, the states of commands for each of the opening/closing devices in the respective modes are compared with the potential level determination signals H90u, H90m, and H90d of the outside monitoring circuit unit 190A, so that it is determined whether or not an external abnormality exists. In the process 1004b, the contents of the parallel monitoring signal PAR are updated; then, the process 1004b is followed by the process 1005a.

In the process 1001a, which is a determination step, it is determined whether or not there exists the series command signal SER based on the selection command produced through the process 901b in FIG. 9A or the processes 913 and 915 in FIG. 9B; in the case where the selection command exists, the result of the determination becomes "YES" and the process 1001a is followed by the process 1001b; in the case where the selection command does not exist, the result of the determination becomes "NO" and the process 1001a is followed by the process 1002a. In the process 1001b, the selection gates of the opening/closing signal selection circuit 132a in FIG. 4 are made to operate in accordance with the contents of the series command signal SER in FIG. 5B; then, the process 1001b is followed by the process 1002a. In the process 1002a, which is a determination step, in the case where the load driving command Son is the circuit-closing command (logic "H"), the result of the determination becomes "YES" and the process 1002a is followed by the process 1002b; in the case where the load driving command Son is the circuit-opening command (logic "L"), the result of the determination becomes "NO" and the process 1002a is followed by the process 1003a. In the case where the process 1002a is followed by the process 1003a, abnormality inspection on the first opening/closing circuit unit 140A and the outside monitoring circuit unit 190A is implemented through an unrepresented determination flow; in the case where the load driving command Son once becomes the circuit-closing command and then becomes the circuit-opening command again, abnormality inspection on the second opening/closing circuit unit 150A and the outside monitoring circuit unit 190A is implemented; in the case where the load driving command Son further becomes the circuit-opening command again, abnormality inspection on the third opening/closing circuit unit 160A and the outside monitoring circuit unit 190A is implemented; after that, the alternate operation is repeated.

The process 1002b is a step in which through the non-selection opening command 133a, the ineffective on/off command circuit 133b, the effective on/off command circuit 133c, and the common opening/closing command 133d in FIG. 4, the circuit-opening command signal, the ineffective opening/closing signal S10, the effective opening/closing signal S01, and the common opening/closing signal S00 are generated, and these generated signals are distributed into the upper-side and lower-side opening/closing timing signals Snu and Snd; the distribution contents here are based on the series command signal SER in FIG. 5B. In the process 1002c, the opening/closing command signals generated in the process 1002b are provided to the upper and lower opening/closing devices distributed in the process 1002b and hence circuit-closing driving of the related opening/closing devices is performed; then, the process 1002c is followed by the process 1005a. In the process 1005a, which is a determination step, it is determined whether or not an abnormality has occurred, based on whether or not abnormality occurrence information is included in the parallel monitoring signal PAR in the process 1004b or whether or not the outside monitoring circuit unit 190A has generated the excessive-current detection signal ERR; in the case where an abnormality has occurred, the result of the determination becomes "YES" and the process 1005a is followed by the process 1005b; in the case where no abnormality has occurred, the result of the determination becomes "NO" and the process 1005a is followed by the process 1006.

In the process 1005b, the contents of the series monitoring signal SER represented in FIG. 5A are updated and then memorized; in the case where the outside monitoring circuit unit 190A generates the excessive-current detection signal ERR, each of the opening/closing command signal is immediately changed to the circuit-opening command; then, the process 1001a is resumed. In the process 1006, in the case where the microprocessor CPU issues the transmission request, the result of the determination becomes "YES" and the process 1006 is followed by the process 1007; in the case where the microprocessor CPU does not issue the transmission request, the result of the determination becomes "NO" and the process 1001a is resumed. In the process 1007, the series monitoring signal SER is transmitted; then, the process 1001a is resumed. The processes 1003b, 1004a, and 1005b are an abnormality detection means (abnormality determination processing unit) at a time when the circuit-opening command is issued, an outside monitoring abnormality determination means, and an abnormality occurrence treating means, respectively.

Next, FIG. 11, which is a timing chart for explaining the operation of the monitoring control circuit unit in FIG. 4, will be explained. In FIG. 11, the timing chart represents that when the load driving command Son at the topmost stage is the circuit-closing command, the logic thereof becomes "H" and that when the load driving command Son is the circuit-opening command, the logic thereof becomes "L". As the upper-side opening/closing timing signal S40u at the second top stage, the ineffective opening/closing signal S10 is provided; the ineffective opening/closing signal S10 is an instantaneous-closing and delayed-opening opening/closing signal that becomes a circuit-closing signal at the same time when the load driving command Son becomes the circuit-closing signal and that becomes a circuit-opening signal after the load driving command Son has become the circuit-opening signal; the circuit-opening delay time corresponds to the time required for cutting off the current in the partner opening/closing device that instantaneously opens. As the lower-side opening/closing timing signal S40d at the third top stage, the effective opening/closing signal S01 is provided; the effective opening/closing signal S01 is a delayed-closing and instantaneous-opening opening/closing signal that becomes the circuit-closing signal after the load driving command Son has become the circuit-closing signal and that becomes a circuit-opening signal at the same time when the load driving command Son becomes the circuit-opening signal; the circuit-closing delay time corresponds to the time required for closing the partner opening/closing device that instantaneously closes.

The load current for the upper and lower opening/closing devices that are connected in series with each other is made to start to flow by one of the opening/closing devices, which closes after the other one thereof closes and is cut off by one of the opening/closing devices, which opens before the other one thereof opens; therefore, the upper-side opening/closing device T40u to which the upper-side opening/closing timing signal S40u, which is the ineffective opening/closing signal S10, is provided is an opening/closing device that is not involved in on/off operation of the load current and in which no switching loss occurs. In contrast, the lower-side opening/closing device T40d to which the lower-side opening/closing timing signal S40d, which is the effective opening/closing signal S01, is provided is an opening/closing device that performs effective on/off operation of the load current and in which a switching loss occurs. As the upper-side opening/closing timing signal S50u at the fourth top stage, the ineffective opening/closing signal S10 is provided in the former half time zone; in the latter half time zone where a short-circuit abnormality occurs in the partner lower-side opening/closing device T50d, the circuit-opening command is provided. As the lower-side opening/closing timing signal S50d at the third bottom stage, the effective opening/closing signal S01 is provided in the former half time zone; in the latter half time zone where a short-circuit abnormality occurs in the subject lower-side opening/closing device T50d, the lower-side opening/closing device T50d is in the closing state although the circuit-opening command is provided.

As the upper-side opening/closing timing signal S60u at the second bottom stage, the circuit-opening command signal (or an after-mentioned special circuit-closing signal S11) is provided in the former half time zone; in the latter half time zone where a short-circuit abnormality occurs in the lower-side opening/closing device T50d, the ineffective opening/closing signal S10 is provided. As the lower-side opening/closing timing signal S60d at the bottommost stage, the circuit-opening command signal (or an after-mentioned special circuit-closing signal S11) is provided in the former half time zone; in the latter half time zone where a short-circuit abnormality occurs in the lower-side opening/closing device T50d, the effective opening/closing signal S01 is provided. Accordingly, at the initial time, the first opening/closing circuit unit 140A and the second opening/closing circuit unit 150A are selectively utilized as the application circuits, and the third opening/closing circuit unit 160A is an auxiliary circuit; however, when a short-circuit abnormality occurs in the lower-side opening/closing device T50d of the second opening/closing circuit unit 150A, the upper-side opening/closing device T50u, which is the pair partner of the lower-side opening/closing device T50d, is opened so that the abnormal circuit is removed from the application circuits and is disconnected; furthermore, the third opening/closing circuit unit 160A, which has been preserved as an auxiliary circuit, is selected as the application circuit.

When the load driving command Son becomes the circuit-closing signal, the special circuit-closing signal S11 becomes the circuit-closing signal further behind the time when the effective opening/closing signal S01 becomes the circuit-closing signal, and when the load driving command Son becomes the circuit-opening signal (at the dotted-line position in FIG. 11), the special circuit-closing signal S11 instantaneously becomes the circuit-opening signal; however, the effective opening/closing signal S01 becomes the circuit-opening signal after the special circuit-closing signal S11 becomes the circuit-opening signal, and the ineffective opening/closing signal S10 becomes the circuit-opening signal further behind the time when the effective opening/closing signal S01 becomes the circuit-opening signal. In the case where the special circuit-closing signal S11, described above, is provided, the upper and lower opening/closing devices to each of which the special circuit-closing signal S11 is provided are closed after any one pair of the upper and lower opening/closing devices among the other upper and lower opening/closing devices is closed, and the upper and lower opening/closing devices to each of which the special circuit-closing signal S11 is provided are opened before the other upper and lower opening/closing devices are opened; thus, the upper and lower opening/closing devices to each of which the special circuit-closing signal S11 is provided are preserved without any switching loss caused by on/off operation of the load current. In this regard, however, after being closed, the upper and lower opening/closing devices to each of which the special circuit-closing signal S11 is provided collaborate with the other opening/closing devices so as to share the supply of the load current.

In the above explanation, when one of the upper and lower opening/closing devices is short-circuited, the other one thereof is opened in order to remove the abnormal circuit unit, and then the circuit-opening command signal is provided to each of the upper and lower opening/closing devices of the abnormal circuit unit; however, in the case where it is desired to utilize such a partially broken opening/closing circuit unit in a revival manner, it is only necessary to provide the effective opening/closing signal S01 to the normal opening/closing device and to provide the ineffective opening/closing signal S10 (it may also be the circuit-opening command signal or the circuit-closing command signal) to the opening/closing device having a short-circuit abnormality. The monitoring control circuit unit 130A, the plurality of opening/closing circuit units UAn, and the outside monitoring circuit unit 190A are integrated as a single integrated circuit; the represented divisions are only for the sake of convenience, and no extra boundary exists between the divisions. Also with regard to mutual signal communication, various embodiments can be imagined; in this SPECIFICATION, there are described embodiments by taking it into main consideration that they can readily be explained.

(3) Gist and Feature of Embodiment 1

As is clear from the foregoing explanation, the load-driving integrated circuit device 110A according to Embodiment 1 of the present invention has the calculation control circuit unit 120A that generates the load driving command Son, which is a command signal for applying the power-source voltage Vbb to the electric load 100, the opening/closing device unit that is connected in series with the negative-side load wiring lead 102d of the electric load and has a plurality of semiconductor opening/closing devices, the monitoring control circuit unit 130A that makes the plurality of semiconductor opening/closing devices perform opening/closing operation in response to the load driving command Son, and the opening/closing integrated device integrated circuit 200A in which the opening/closing device unit and the monitoring control circuit unit 130A are integrated on a semiconductor chip; the opening/closing device unit has a plurality of opening/closing circuit units UAn (n=40, 50, 60, . . . ) which are equal to or more than three opening/closing circuit units of the first opening/closing circuit unit 140A, the second opening/closing circuit unit 150A, and the third opening/closing circuit unit 160A, which are connected in parallel with one another.

Each of the plurality of opening/closing circuit units UAn has upper and lower opening/closing devices which form a pair of upper-side opening/closing device T40u•T50u•T60u (hereinafter, described as Tnu) and lower-side opening/closing device T40d•T50d•T60d (hereinafter, described as Tnd) which are connected in series with each other, and the connection point potential detection circuit 146•156•166 that generates an output voltage corresponding to the potential of the connection point between the upper-side opening/closing device Tnu and the lower-side opening/closing device Tnd; the calculation control circuit unit 120A has the application circuit selection means 919 that selects application circuits, which are opening/closing circuit units for performing on/off operation of the load current corresponding to the load driving command Son, from the plurality of opening/closing circuit units UAn; in the case where it is determined based on the output voltage of the connection point potential detection circuit 146•156•166 that a device disconnection abnormality or a device snort-circuit abnormality has occurred in the upper-side opening/closing device Tnu or the lower-side opening/closing device Tnd, the application circuit selection means 919 removes an opening/closing circuit unit, in which an abnormality has occurred, from the application circuits, and includes an auxiliary circuit, which is a normal opening/closing circuit unit that has not been selected as the application circuit, in the application circuits in the case where there is the auxiliary circuit; the monitoring control circuit unit 130A has the opening/closing signal selection circuit 132a that distributes the opening/closing signals corresponding to the load driving command Son into the upper and lower opening/closing devices Tnu and Tnd of the application circuit selected by the application circuit selection means 919.

The opening/closing signal selection circuit 132a provides the upper-side opening/closing timing signal Snu and the lower-side opening/closing timing signal Snd, which are the common opening/closing signals S00 generated at the same timing in response to the load driving command Son, to the upper and lower opening/closing devices Tnu and Tnd of the application circuit. Alternatively, the opening/closing signal selection circuit 132a is provided with the effective on/off command circuit 133c that generates the effective opening/closing signal S01 which performs delayed closing and instantaneous opening of one of the upper and lower opening/closing devices Tnu and Tnd of the application circuit in response to a logic level of the load driving command Son, or generates the effective opening/closing signal S01 with which one of the upper and lower opening/closing devices Tnu and Tnd of the application circuit becomes an opening state at least when the other one of the upper and lower opening/closing devices Tnu and Tnd of the application circuit performs opening/closing operation; and the ineffective on/off command circuit 133b that generates the ineffective opening/closing signal S10 which performs instantaneous closing and delayed opening of the other one of the upper and lower opening/closing devices Tnu and Tnd of the application circuit in response to the logic level of the load driving command Son, or generates the ineffective opening/closing signal S10 with which the other one of the upper and lower opening/closing devices Tnu and Tnd of the application circuit performs opening/closing operation at least in a period in which one of the upper and lower opening/closing devices Tnu and Tnd of the application circuit is opened; the ineffective opening/closing signal S10 becomes the upper-side opening/closing timing signal Snu or the lower-side opening/closing timing signal Snd which is generated for one of the upper and lower opening/closing devices Tnu and Tnd of the application circuit; the effective opening/closing signal S01 becomes the upper-side opening/closing timing signal Snu or the lower-side opening/closing timing signal Snd which is generated for the other one of the upper and lower opening/closing devices of the application circuit.

As described above, with regard to claim 2 of the present invention, there are provided the ineffective on/off command circuit and the effective on/off command circuit; when one of the upper-side opening/closing device and the lower-side opening/closing device that are connected in series with each other performs on/off operation of the load current, the other one thereof is closed or the common opening/closing signal for performing simultaneous on/off operation of the load current is provided to the upper and lower opening/closing devices. Accordingly, in the case where the electric load is an inductive load, no commutation diode is connected in parallel therewith, and a high-voltage surge absorption diode is connected in parallel therewith, all the respective high voltages generated, at a time when the current is cut off, across the plurality of opening/closing devices that perform effective on/off operation become one and the same because the corresponding pair-partner serial opening/closing devices that perform ineffective on/off operation are preliminarily closed. As a result, the variation in the switching losses of the opening/closing devices is suppressed and there is demonstrated a characteristic that because no switching loss occurs therein, the opening/closing devices that perform ineffective on/off operation are preserved without any stress caused by the on/off operation.

Also in the closing operation, the variation in the switching losses of a plurality of opening/closing devices that perform effective on/off operation is suppressed and no switching loss occurs in the opening/closing device that performs ineffective on/off operation; because in comparison with a discrete circuit method, even arrangement and homogeneous wiring are implemented in the integrated circuit device, the variation in the current distribution into the parallel circuits in the closing state is suppressed; thus, there is demonstrated a characteristic that it is made possible to disperse the load current and the switching loss so that neither an excessive burden of the load current nor an excessive switching loss concentrates on a specific opening/closing device. Moreover, in the case where when the ineffective opening/closing signal is for instantaneous closing and delayed opening, a short-circuit abnormality occurs in the effective opening/closing device while circuit-closing drive is applied to the upper and lower opening/closing devices, the ineffective opening/closing device cuts off the load current at the time when a delay time elapses immediately after the load driving command is cancelled; accordingly, in comparison with the case where after a short-circuit abnormality in the effective opening/closing device is detected, the ineffective opening/closing device is opened, the load current can quickly be cut off; thus, there is demonstrated a characteristic that there can be shortened the time in which all the load current flows in the opening/closing circuit unit with an abnormality in a concentrated manner. Even in the case where when a commutation diode is connected in parallel with the electric load that operates at a low voltage, the common opening/closing signal makes both the upper and lower opening/closing devices instantaneously close and instantaneously opens, no uneven burden of loss poses a problem, because the respective circuit-opening voltages of the opening/closing devices are low and hence the switching losses are small. Embodiment 2 also demonstrates the same characteristic.

The opening/closing signal selection circuit 132a sets both the upper-side opening/closing timing signal Snu and the lower-side opening/closing timing signal Snd for the upper and lower opening/closing devices in the auxiliary circuit, which is not selected as the application circuit, to the circuit-opening command or to the special circuit-closing signal S11 for closing later than closing of the effective opening/closing signal S01, and opening earlier than opening of the effective opening/closing signal S01; after the auxiliary circuit is selected as the application circuit, the opening/closing signal selection circuit 132a switches the opening/closing timing signal for one of the upper and lower opening/closing devices Tnu and Tnd to the ineffective opening/closing signal S10 and switches the opening/closing timing signal for the other one thereof to the effective opening/closing signal S01.

As described above, with regard to claim 3 of the present invention, the opening/closing command signal for both the upper and lower opening/closing devices in the auxiliary circuit that is not selected as the application circuit is set to the circuit-opening command or the special circuit-closing signal that does not implement on/off operation of the load current in an effective manner is provided to the auxiliary circuit. Thus, in the case where the special circuit-closing signal is provided, the non-selection auxiliary circuit is not involved in the on/off operation of the load current; however, as is the case with the other application circuits, the non-selection auxiliary circuit shares the load current during the closing state; thus, there is demonstrated a characteristic that the sharing current of each of the opening/closing devices can be suppressed. In the case where the circuit-opening command is provided to both the upper and lower opening/closing devices, no temporary excessive-current stress, which is caused by a load short-circuit abnormality during the closing operation, may occur in the non-selection auxiliary circuit; thus, there is demonstrated a characteristic that the non-selection auxiliary circuit can be preserved as a non-defective circuit unit. Embodiment 2 also demonstrates the same characteristic.

The application circuit selection means 919 has a revival circuit selection means 915 that selects the opening/closing circuit unit having normal upper and lower opening/closing devices, as the application circuit, that selectively removes a disconnection opening/closing circuit unit, in which at least one of the upper and lower opening/closing devices has a device disconnection abnormality, from the application circuit, and that selects in a revival manner a partially broken opening/closing circuit unit, in which one of the upper and lower opening/closing devices has a device short-circuit abnormality and the other one thereof is normal, as the application circuit; the opening/closing signal selection circuit 132a provides the ineffective opening/closing signal S10 to one of the upper and lower opening/closing devices Tnu and Tnd in the application circuit selected by the application circuit selection means 919 and provides the effective opening/closing signal S01 to the other one of the upper and lower opening/closing devices Tnu and Tnd in the application circuit; before the revival selection, both the upper-side and lower-side opening/closing timing signals Snu and Snd are set to the circuit-opening command; however, after the revival selection, in response to the revival circuit selection means 915, the opening/closing signal selection circuit 132a provides the effective opening/closing signal S01 to any normal one of the upper and lower opening/closing devices Tnu and Tnd and provides the circuit-opening command signal, the circuit-closing command signal, or the ineffective opening/closing signal S10 to the other one, of the upper and lower opening/closing devices Tnu and Tnd, which has a short-circuit abnormality.

As described above, with regard to claim 4 of the present invention, in the case of a normal opening/closing circuit unit, the ineffective opening/closing signal is provided to the lower-side opening/closing device or the upper-side opening/closing device (for example, the lower-side opening/closing device) and the effective opening/closing signal is provided to the upper-side opening/closing device or the lower-side opening/closing device (for example, the upper-side opening/closing device); the opening/closing signal at a time before the partially broken opening/closing circuit unit is selected as the application circuit in a revival manner is set to the circuit-opening command; after the partially broken opening/closing circuit unit has been selected in a revival manner, the effective opening/closing signal is provided to the normal opening/closing device (for example, the lower-side opening/closing device) having no short-circuit abnormality. Therefore, there is demonstrated a characteristic that the upper-side or lower-side normal opening/closing device (for example, the lower-side opening/closing device) in the opening/closing circuit unit selected in a revival manner collaborates with the upper-side or lower-side normal opening/closing device (for example, the upper-side opening/closing device) in another opening/closing circuit unit so that the on/off operation of the load current can be shared and implemented at the same timing. Embodiment 2 also demonstrates the same characteristic.

The calculation control circuit unit 120A includes an effective circuit number calculation means 916 and the conduction suppression means 917; the effective circuit number calculation means 916 calculates the effective number of opening/closing circuit units, each of which is selected as the application circuits by the application circuit selection means 919 and is performing normal operation; when the effective number calculated by the effective circuit number calculation means 916 is smaller than an appropriate number, the conduction suppression means 917 applies subtraction correction to the conduction duty rate, which is the proportion of the circuit-closing time of the effective opening/closing signal to the opening/closing period thereof, or the opening/closing frequency, in accordance with the proportion of the effective number to the appropriate number; the appropriate number is preliminarily set to the number of opening/closing circuit units to be selected as the application circuits when no selective removal due to abnormality determination exists, As described above, with regard to claim 5 of the present invention, subtraction correction is applied to the conduction duty rate or the opening/closing frequency of the effective opening/closing signal in accordance with the effective number of opening/closing circuit units that are selectively utilized. Thus, there is demonstrated a characteristic that in the case where due to an abnormality in the external wiring lead or the electric load, part of the plurality of opening/closing circuit units are damaged and the necessary current capacity or heat-resistance capacity still cannot be obtained even when an auxiliary circuit is utilized, it is made possible to perform limitation operation in which the load current or the opening/closing frequency is suppressed. Embodiment 2 also demonstrates the same characteristic.

Each of the plurality of opening/closing circuit units UAn has the upper-side parallel resistor 144u•154u•164u for the upper-side opening/closing device Tnu, the lower-side parallel resistor 144d•154d•164d for the lower-side opening/closing device Tnd, and the connection point potential detection circuit 146•156•166 that detects the potential of the connection point between the upper-side opening/closing device Tnu and the lower-side opening/closing device Tnd; the output voltage of the connection point potential detection circuit 146•156•166 is a preliminarily set value that differs corresponding to a closing state in which only one of the upper and lower opening/closing devices Tnu and Tnd is closed, a closing state in which only the other one thereof is closed, or an opening state in which both thereof are opened; the monitoring control circuit unit 130A has the abnormality determination processing unit 134; the abnormality determination processing unit 134 compares the state of the opening/closing command for the upper or lower opening/closing device Tnu•Tnd with the state of the output voltage of the connection point potential detection circuit 146•156•166 so as to separately determine whether or not a device disconnection abnormality or a device short-circuit abnormality exists in the upper-side opening/closing device Tnu and/or the lower-side opening/closing device Tnd.

As described above, with regard to claim 6 of the present invention, each of the plurality of opening/closing circuit units has the upper-side parallel resistor, the lower-side parallel resistor, and the connection point potential detection circuit; the monitoring control circuit unit has an abnormality detection means, for a time when the circuit-opening command is issued, that compares the states of the command signals for the plurality of opening/closing circuit units with state signals obtained from the respective connection point potential detection circuits of the corresponding opening/closing circuit units so as to separately detect whether or not a device short-circuit abnormality or a device disconnection abnormality exists in each of the respective opening/closing devices in the opening/closing circuit units. Thus, because during power-supply driving of the electric load, the confirmation of the circuit-opening operation by each of the opening/closing devices is not performed, the power supply is not carelessly stopped; because while the power supply is stopped, simultaneous closing of the opening/closing devices is not implemented and the opening/closing operational actions are separately confirmed, the power-supply driving of the electric load is not carelessly implemented; thus, there is demonstrated a characteristic that it is made possible that provided one of the opening/closing devices has a short-circuit abnormality, circuit-closing driving is not applied to the other one of the opening/closing devices. Even in the case where while one of the opening/closing devices has a short-circuit abnormality, circuit-closing driving is applied to the other one thereof only for a moment in order to detect an abnormality, it is made possible to limit the circuit-closing drive time so that the circuit-closing driving does not substantially drive the electric load.

Each of the plurality of opening/closing circuit units UAn has the distribution resistor 147a•157a•167a further connected in series with the upper and lower opening/closing devices Tnu and Tnd; the distribution resistor 147a•157a•167a is a wiring-lead resistor provided on the semiconductor chip or a bonding wire connecting an electrode pad provided on the semiconductor chip with an external connection terminal provided outside the semiconductor chip; each of the resistance values of the distribution resistor 147a•157a•167a and the bonding wire has a positive temperature coefficient with which the resistance value increases as the temperature rises; the distribution resistor 147a•157a•167a is a thin-wire resistor that is heated and melted by a load current when all of the load current in the electric load 100 continuously flows in any one of the plurality of the distribution resistors 147a, 157a, and •167a.

As described above, with regard to claim 7 of the present invention, a thin-wire distribution resistor having a positive temperature coefficient is connected in series with each of the plurality of opening/closing circuit units. Accordingly, in the case where there exists individual unevenness in the internal resistances of the upper and lower opening/closing devices provided in the plurality of opening/closing circuit units that are connected in parallel with one another and hence the sharing of the load current is not even, a large current flows in the opening/closing device having a smaller resistance value, thereby raising the temperature of the opening/closing device; as a result, the resistance value of the corresponding distribution resistor having a positive temperature coefficient increases; thus, there is demonstrated a characteristic that the variation in the sharing of the load current can be suppressed. In the case where while the circuit-opening command is provided to the plurality of opening/closing circuit units, there occurs an abnormality in which both the upper and lower opening/closing devices in a single opening/closing circuit unit are short-circuited, the load current of the electric load flows intensively in this pair of opening/closing devices and hence the distribution resistor is melted so that the abnormal device can be disconnected; because in the normal state, the load current is ramified into the plurality of opening/closing circuit units, this ramification current does not melt the distribution resistor; thus, there is demonstrated a characteristic that it is made possible to readily set the melting current value. Embodiment 2 also demonstrates the same characteristic.

There is further provided the outside monitoring circuit unit 190A that monitors the ground potential of the negative-side load wiring lead 102d which is connected with the power-source voltage Vbb by way of the pull-up circuit 103u and connected with the ground circuit GND by way of the pull-down circuit 103d; the outside monitoring circuit unit 190A has the wiring lead potential detection circuit 196 that generates an output voltage corresponding to the ground potential of the negative-side load wiring lead 102d in the resistor circuit including the pull-up circuit 103u, the pull-down circuit 103d, the series circuit consisting of the upper-side parallel resistor 144u•154u•164u and the lower-side parallel resistor 144d•154d•164d of each of the plurality of opening/closing circuit units UAn connected in parallel with the pull-down circuit 103d; the monitoring control circuit unit 130A has the outside monitoring abnormality determination means 1004a that compares the state of the load driving command Son for the electric load 100 with the output voltage of the wiring lead potential detection circuit 196 so as to separately or integrally determine whether or not there exists a short-to-power abnormality in which the negative-side load wiring lead 102d makes mixture contact with the power-source wiring lead 102P or a load short-circuit abnormality, whether or not there exists a short-to-ground abnormality in which the negative-side load wiring lead 102d makes mixture contact with the ground circuit GND, and whether or not there exists a load disconnection abnormality including an internal disconnection of the electric load 100, or a disconnection of the negative-side load wiring lead 102d.

The outside monitoring circuit unit 190A further has the excessive-current detection circuit 198a and the excessive-current occurrence memory circuit 198c; when the composite detection voltage obtained by adding the respective voltages across the distribution resistors 147a, 157a, and 167a provided in the plurality of opening/closing circuit units UAn exceeds the excessive-current detection voltage 198b preliminarily set in accordance with a maximum load current flowing in the electric load 100, the excessive-current detection circuit 198a sets the excessive-current occurrence memory circuit 198c so as to make the excessive-current occurrence memory circuit 198c generate the excessive-current detection signal ERR; the monitoring control circuit unit 130A has an abnormality occurrence treating means 1005b; the calculation control circuit unit 120A has an abnormality occurrence processing means 903c; when the excessive-current detection signal ERR occurs, the abnormality occurrence treating means 1005b stops the circuit-closing command signals for all the upper-side opening/closing devices Tnu and all the lower-side opening/closing devices Tnd in the plurality of opening/closing circuit units; when the excessive-current detection signal ERR occurs, the abnormality occurrence processing means 903c stops the load driving commands Son for all the plurality of opening/closing circuit units UAn and then generates the reset command RST for the excessive-current occurrence memory circuit 198c.

As described above, with regard to claim 8 of the present invention, in response to the composite voltage of the current detection voltages obtained through the respective distribution resistors provided in the plurality of opening/closing circuit units, the excessive-current detection circuit and the excessive-current occurrence memory circuit provided in the outside monitoring circuit unit detect and memorize the occurrence of an excessive current abnormality caused by a short-circuit abnormality or the like in the electric load and then stop the circuit-closing commands for all the opening/closing devices through the calculation control unit and the monitoring control circuit unit. Thus, there is demonstrated a characteristic that in comparison with the case where the whole load current for the electric load is directly detected, the heat in the distribution resistor utilized for detecting the current can be dispersed and that it is made possible to raise the current-detection accuracy by enlarging each of the current-detection voltages. Moreover, there is demonstrated a characteristic that by monitoring each of the current-detection voltages, it can be confirmed that in each of the opening/closing circuit units, circuit-closing driving is applied to both the upper-side opening/closing device and the lower-side opening/closing device in response to the provided circuit-closing command.

The calculation control circuit unit 120A includes the program memory PMEM and the microprocessor CPU that collaborates with the program memory PMEM, and is provided with the serial-parallel converter SPC for performing upstream and downstream communication of serial signals with the monitoring control circuit unit 130A by setting the microprocessor CPU as a master station, and a direct line for receiving the parallel monitoring signal PAR transmitted from the monitoring control circuit unit 130A; through the downstream communication by the serial-parallel converter SPC, the microprocessor CPU transmits selection determination information indicating the application circuit selected by the application circuit selection means 919, to the monitoring control circuit unit 130A; the connection point potential detection circuit 146•156•166 generates potential level determination signal H40$u$•H40$m$•H40$d$, H50$u$•H50$m$•H50$d$, H60$u$•H60$m$•H60$d$ (hereinafter, described as Hnu•Hnm•Hnd) indicating the result of comparison between the reference potential and the potential of the connection point between the upper-side opening/closing device Tnu and the lower-side opening/closing device Tnd; the monitoring control circuit unit 130A has the opening/closing signal selection circuit 132$a$ that, in response to the selection determination information transmitted from the microprocessor CPU and the logic level of the load driving command Son, generates the circuit-opening command signal for the upper and lower opening/closing devices Tnu and Tnd of a non-selection circuit unit, which is not selected as the application circuit, and generates the effective opening/closing signal S01, the ineffective opening/closing signal S10, or the common opening/closing signal S00, for the upper and lower opening/closing devices Tnu and Tnd of the application circuit; and then utilize them as the upper-side and lower-side opening/closing timing signals Snu and Snd; the monitoring control circuit unit 130A also has the abnormality determination processing unit 134 that sequentially issues a circuit-opening command for opening both the upper and lower opening/closing devices Tnu and Tnd, a circuit-closing command for generating the upper-side circuit closing specification signal D40$u$•D50$u$•D60$u$ (hereinafter, described as Dnu) which closes only the upper-side opening/closing device Tnu, and a circuit-closing command for generating the lower-side circuit closing specification signal D40$d$•D50$d$•D60$d$ (hereinafter, described as Dnd) which closes only the lower-side opening/closing device Tnd, when the load driving command Son is the circuit-opening command; and that compares the state of the opening/closing command for the upper or lower opening/closing device Tnu•Tnd with the potential level determination signal Hnu•Hnm•Hnd of the connection point potential detection circuit 146•156•166 at a time when each of the opening/closing commands is issued and that separately determine whether or not a disconnection abnormality or a short-circuit abnormality exists in each of the opening/closing devices; furthermore, the monitoring control circuit unit 130A transmits abnormality occurrence information indicating the opening/closing circuit having an abnormality, and the kind of abnormality, which are determined by the abnormality determination processing unit 134, through the upstream communication by the serial-parallel converter SPC, to the microprocessor, and transmits whether or not an abnormality exists, by means of the parallel monitoring signal PAR.

As described above, with regard to claim 9 of the present invention, the monitoring control circuit unit has an abnormality determination processing unit that performs opening/closing operation of each of the opening/closing devices for the purpose of monitoring, sequentially and separately determines whether or not there exists a short-circuit abnormality or a disconnection abnormality in each of the opening/closing devices, and then transmits the determination result in a serial manner to the calculation control circuit unit; whether or not an abnormality has occurred is immediately transmitted through a direct line; based on the received abnormality occurrence information, the calculation control circuit unit determines which one of the plurality of opening/closing circuit units is selected as the application circuit and then transmits selection determination information in a serial manner to the monitoring control circuit unit. The monitoring control circuit unit is provided with an opening/closing signal selection circuit and creates the upper-side and lower-side opening/closing timing signals from the load driving command, based on the transmitted selection determination information. Thus, there is demonstrated a characteristic that the control load, for performing selection determination and driving control, on the calculation control circuit unit is reduced and high-speed responding processing can be performed by means of a small number of lines.

Detailed Explanation for Embodiment 2

(1) Detailed Description of Configuration

Figure 12:
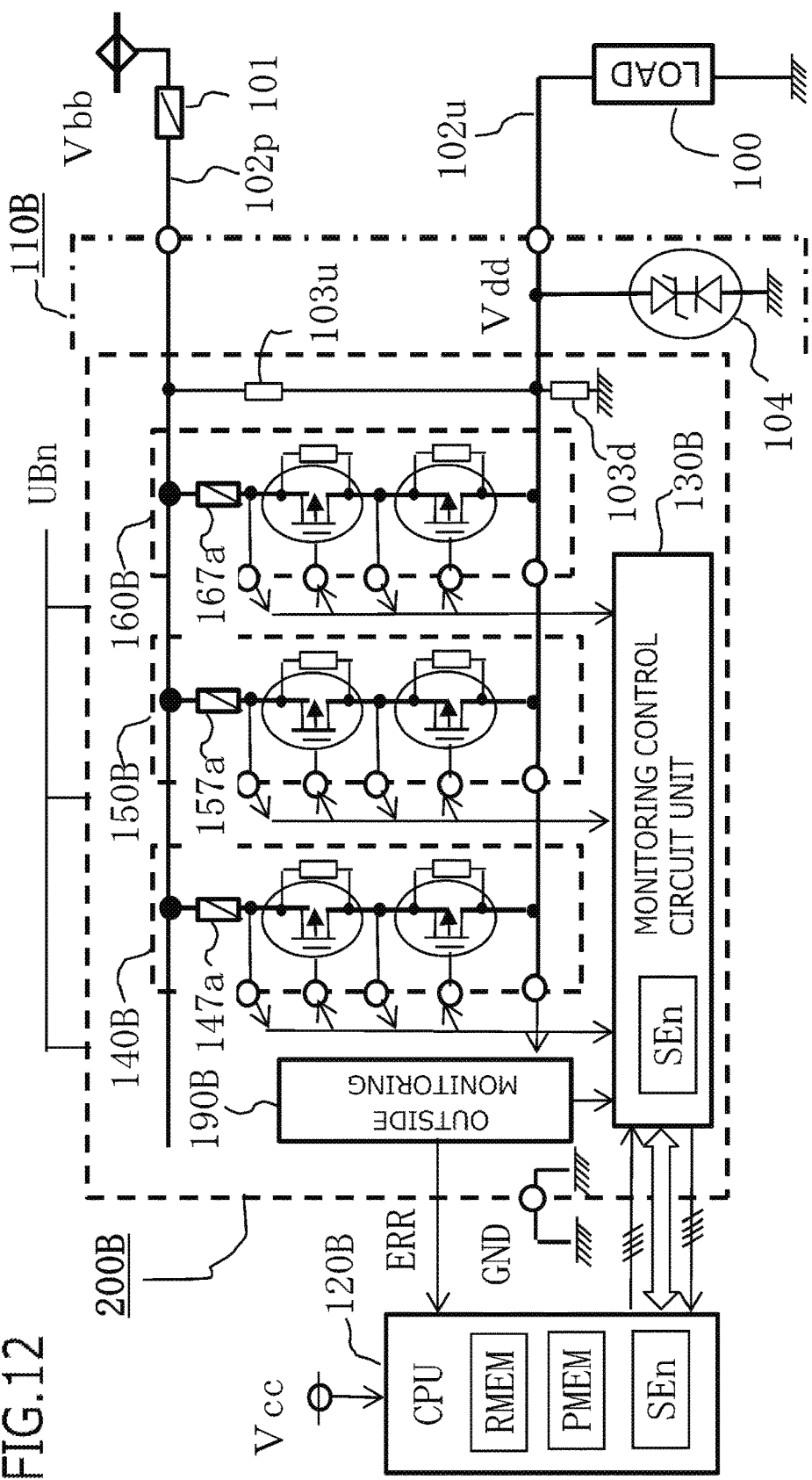
FIG. 12 is a block diagram representing the overall circuit of a load-driving integrated circuit device according to Embodiment 2 of the present invention.

Hereinafter, FIG. 12, which is a block diagram representing the overall circuit of a load-driving integrated circuit device 110B according to Embodiment 2 of the present invention, and FIG. 13, which is a detailed block diagram representing the system of monitoring/control signals in FIG. 12, will be explained in detail. The main differences between Embodiment 1 and Embodiment 2 are that the connection position of a plurality of opening/closing circuit units is changed from the downstream position to an upstream position of the electric load 100 and that the abnormality-determination function for opening/closing devices is moved from the monitoring control circuit unit to an calculation control circuit unit and hence the configuration of communication between the integrated circuit device and the calculation control circuit unit is changed; in respective units, the same reference characters denote the same or similar portions, and capital-letter characters A and B relate to Embodiment 1 and Embodiment 2, respectively. In FIG. 12, an opening/closing device integrated circuit 200B is disposed in such a way as to collaborate with a calculation control circuit unit 120B in order to perform on/off control of the load current in the electric load 100 at an upstream position thereof. The power-source voltage Vbb of DC 12V, for example, from an unillustrated vehicle battery is applied to the plurality of opening/closing circuit units UBn by way of the power-source fuse 101 provided inside an unillustrated power-supply unit and the power-source wiring lead 102P. A positive-side load wiring lead 102$u$ of the electric load 100 is connected with the power-source wiring lead 102P in an on/off manner, through the plurality of opening/closing circuit units UBn; the negative-side terminal of the electric load 100 is connected with the ground circuit GND.

In the case where the electric load 100 is an inductive load, the surge absorption circuit 104 is connected in parallel with the electric load 100; in the case where when the opening/closing circuit unit UBn cuts off the load current, it is desired to gently attenuate the load current, a commutation diode, as the surge absorption circuit 104, is utilized; in the case where it is desired to quickly attenuate the load current, a varistor, which becomes conductive when a voltage of, for example, several volts is applied thereto, is utilized. Accordingly, as is the case with Embodiment 1, when a commutation diode is utilized, the cutoff voltage generated in the opening/closing circuit unit UBn is approximately the same as the power-source voltage Vbb, and when a varistor is utilized, the cutoff voltage is several tens volts corresponding to the operating voltage thereof and hence the switching loss in the opening/closing circuit unit UBn becomes large. The calculation control circuit unit 120B is mounted on one and the same substrate as the opening/closing device integrated circuit 200B is; when supplied with a stabilized voltage Vcc of, for example, DC 5V by an unillustrated constant voltage power source, the calculation control circuit unit 120A operates. As is the case with Embodiment 1, the calculation control circuit unit 120B mainly includes a microprocessor CPU that collaborates with the program memory PMEM and the RAM memory RMEM for calculation processing.

A monitoring control circuit unit 130B that forms part of the opening/closing device integrated circuit 200B performs communication of after-mentioned monitoring/control signals with the calculation control circuit unit 120B; the monitoring control circuit unit 130B is connected with the first opening/closing circuit unit 140B, the second opening/closing circuit unit 150B, and the third opening/closing circuit unit 160B, i.e., the plurality of opening/closing circuit units UBn (n=40, 50, 60, . . . ) that are connected in parallel with one another. As described in FIG. 2, each of the plurality of opening/closing circuit units UBn includes upper and lower opening/closing devices, i.e., the upper-side opening/closing device Tnu and the lower-side opening/closing device Tnd that are connected in series with each other; in Embodiment 2, each of the opening/closing devices is an P-channel field effect transistor and is connected to the upstream position of the electric load 100. An outside monitoring circuit unit 190B monitors the load wiring lead voltage Vdd, which is the ground potential of a positive-side load wiring lead 102u, so as to determine whether or not there exists a short-to-ground abnormality in which the positive-side load wiring lead 102u makes mixture contact with the ground circuit GND or a short-circuit abnormality in the electric load 100 itself, whether or not there exists a short-to-power abnormality in which the positive-side load wiring lead 102u makes mixture contact with the power-source wiring lead 102P, and whether or not there exists a load disconnection abnormality which is a disconnection of the positive-side load wiring lead 102u or an internal disconnection of the electric load 100 itself. The pull-up circuit 103u is connected between the positive-side load wiring lead 102u and the power-source wiring lead 102P; the pull-down circuit 103d is connected between the positive-side load wiring lead 102u and the ground circuit GND.

The detailed circuit diagram of the first opening/closing circuit unit 140B corresponding to the first opening/closing circuit unit 140A represented in FIG. 2 is omitted; simply explaining this by use of FIG. 2, because each of the upper-side opening/closing device T40u and the lower-side opening/closing device T40d in the first opening/closing circuit unit 140B is a P-channel field-effect transistor, the load wiring lead voltage Vdd in FIG. 2 is replaced by the power-source voltage Vbb and respective logic inverting devices are provided in the output circuits of the upper-side circuit closing command circuit 141u and the lower-side circuit closing command circuit 141d, so that the first opening/closing circuit unit 140B is configured. Because as represented in FIG. 12, the distribution resistor 147a is connected with the power-source wiring lead 102P, it is only necessary that the voltage across the distribution resistor 147a is temporarily amplified by a differential amplifier and the output voltage of the differential amplifier is applied to the current detection circuit 148a and the base circuit of each of the fusing abnormality detection devices 149b and 149bb. Similarly, the detailed circuit diagram of the outside monitoring circuit unit 190B corresponding to the outside monitoring circuit unit 190A represented in FIG. 3 is omitted; explaining this by use of FIGS. 3 and 12, because the monitoring input signal for the wiring lead potential detection circuit 196 in FIG. 3 becomes the positive-side load wiring lead 102u in FIG. 12, it is only necessary that the input signal for the excessive-current detection circuit 198a in FIG. 3 is replaced by a signal voltage obtained by making a differential amplifier amplify the voltage across the distribution resistor 147a connected with the power-source wiring lead 102P.

Figure 13:
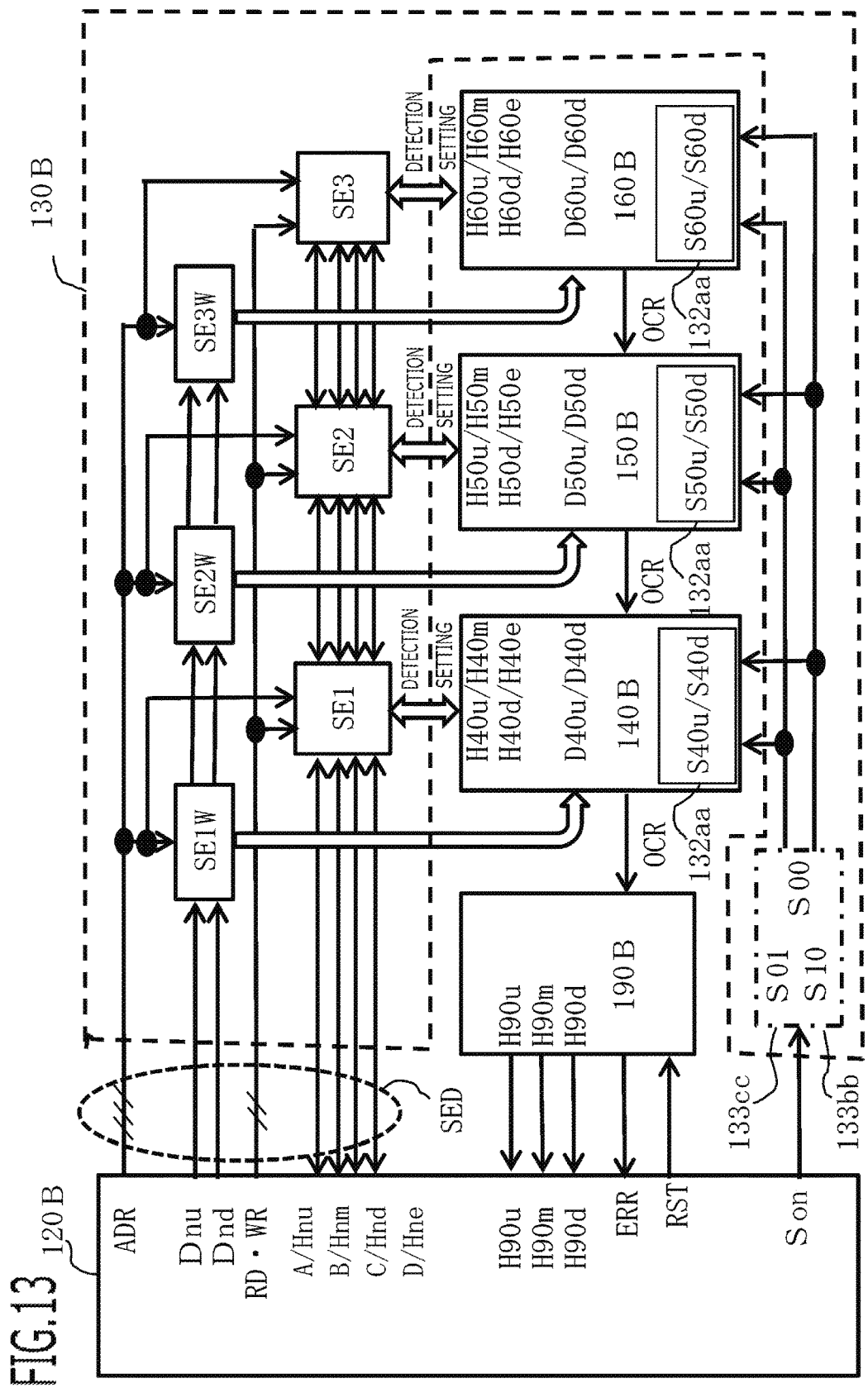
FIG. 13 is a detailed block diagram representing the system of monitoring/control signals in FIG. 12.

In FIG. 13, the monitoring control circuit unit 130B that performs communication of monitoring/control signals with the calculation control circuit unit 120B has output destination selection circuits SE1W, SE2W, and SE3W and input/output destination selection circuits SE1, SE2, and SE3 that correspond to the first, second, and third opening/closing circuit units 140B, 150B, and 160B, respectively, for which respective inherent address numbers are set. The opening/closing circuit unit that has an address number coinciding with address designation data ADR of, for example, 3 bits, transmitted by the calculation control circuit unit 120B, acquires the right of communicating with the calculation control circuit unit 120B and can perform communication of monitoring/control signals. For example, when the address of the first opening/closing circuit unit 140B is designated, the upper-side circuit closing specification signal Dnu and the lower-side circuit closing specification signal Dnd that are generated by the calculation control circuit unit 120B become the upper-side circuit closing specification signal D40u and the lower-side circuit closing specification signal D40d, respectively, for the first opening/closing circuit unit 140B; when the calculation control circuit unit 120B changes the logic levels of (D40u, D40d) to (L, L), (L, H), and (H, L) in a sequential manner, these signals become the opening/closing command signals for the upper-side opening/closing device T40u and the lower-side opening/closing device T40d by way of the output destination selection circuit SE1w. The potential level determination signals H40u, H40m, and H40d, which respond to the abnormality-inspection opening/closing signals in three modes, and the current detection signal H40e are transmitted, as a 4-bit upstream signal, to the calculation control circuit unit 120B by way of the input/output destination selection circuit SE1. In this regard, however, when the monitoring signal is read, the logic level of a detection command signal RD for the input/output destination selection circuit SE1 is made "H".

The calculation control circuit unit 120B performs transmission of the abnormality-detection opening/closing signals for all the opening/closing circuit units and reception of the corresponding monitoring signals, determines whether or not there exists a disconnection abnormality or a short-circuit abnormality in each of the opening/closing devices, and then transmits the selection command signals. The contents of the selection command signal are as represented in the application classifications A through D in FIG. 5B, and are transmitted, as 2-bit downstream signals, through the input/output destination selection circuits SE1, SE2, and SE3; when the contents of the selection command signal are transmitted, the logic level of a setting command signal WR is made "H". While the opening/closing device integrated circuit 200B is operated, the monitoring control circuit unit 130B has a non-select ion opening command 133aa (unrepresented) for generating the circuit-opening command signal, as described above in FIG. 4, in response to the load driving command Son generated by the calculation control circuit unit 120B, a common opening/closing command 133d (unrepresented) for generating the common opening/closing signal S00, an effective on/off command circuit 133cc for generating the effective opening/closing signal S01, and an ineffective on/off command circuit 133bb for generating the ineffective opening/closing signal S10. Each of the opening/closing circuit units (or the monitoring control circuit unit 130B) has an opening/closing signal selection circuit 132aa that determines the combination of the opening/closing signals, for the respective opening/closing devices, that are transmitted from the calculation control circuit unit 120B.

In contrast, the potential level determination signals H90u, H90m, and H90d and the excessive-current detection signal ERR that are generated by the outside monitoring circuit unit 190B are directly transmitted to the calculation control circuit unit 120B, so that it is determined whether or not there exists a short-to-power abnormality, a short-to-ground abnormality, or a disconnection abnormality in the positive-side load wiring lead 102u. The pull-up circuit 103u connected between the positive-side load wiring lead 102u and the power-source wiring lead 102P and the pull-down circuit 103d connected between the positive-side load wiring lead 102u and the ground circuit GND is for opening all the opening/closing devices and determining the potential of the positive-side load wiring lead 102u to the ground potential at a time when the electric load 100 is not connected; a voltage dividing resistor having a resistance value that is sufficiently larger than the load resistance value of the electric load 100 and a constant current circuit for suppressing the current flowing in the voltage dividing resistor are connected in parallel with the electric load 100. The resistance value of the combined series resistor of the upper-side parallel resistor 14 4u and the lower-side parallel resistor 144d (refer to FIG. 2) that are connected in series with the corresponding opening/closing devices and the resistance value obtained by connecting in parallel all the combined series resistors of the plurality of opening/closing circuit units are each sufficiently larger than the equivalent resistance value of the pull-up circuit 103u or the pull-down circuit 103d; the same applies also to Embodiment 1.

(2) Detailed Description of Operation and Action

Hereinafter, with regard to the electric-load-driving integrated circuit device, configured as represented in FIG. 12, according to Embodiment 2 of the present invention, there will be explained in detail FIGS. 14A, 14B, and 14C related to the former stage portion, the middle stage portion, and the latter stage portion of a flowchart for explaining the operation of the calculation control circuit unit in FIG. 12 and FIG. 15, which is a flowchart for explaining the operation of the monitoring control circuit unit in FIG. 12. FIGS. 14B and 14C are flowcharts that are the same as the respective flowcharts in FIGS. 9B and 9C; thus, the same characters are utilized. Firstly, in FIG. 12, when an unillustrated power switch is closed, the output contact of an unillustrated main power source relay is closed and hence an unillustrated constant voltage power source circuit generates a stabilized voltage Vcc, so that the microprocessor CPU, which is the main element in the calculation control circuit unit 120B, starts control operation. As a result, an unillustrated load power source relay is energized and hence the electric load 100 is supplied with the power-source voltage Vbb through the opening/closing device integrated circuit 200B. In response to the operation state of an unillustrated group of sensors and the contents of the control program, stored in the nonvolatile program memory PMEM, the microprocessor CPU generates the load driving command Son so as to perform on/off control of the load current for the electric load 100.

The outline of the monitoring control operation of the opening/closing device integrated circuit 200B, described later in detail, is as follows: The monitoring control circuit unit 130B and the plurality of opening/closing circuit units UBn included in the opening/closing device integrated circuit 200B generate monitoring signals (potential level determination signals) for determining whether or not a disconnection abnormality or a short-circuit abnormality exists in the upper-side opening/closing device Tnu and the lower-side opening/closing device Tnd provided in each of the opening/closing circuit units, and report the monitoring information to the calculation control circuit unit 120B (device opening/closing state monitoring). The calculation control circuit unit 120B generates opening/closing command signals for performing abnormality monitoring and has an abnormality determination processing unit (abnormality determination means) that performs comparison with monitoring information obtained from the monitoring control circuit unit 130B so as to determine whether or not an abnormality has occurred and an application circuit selection means (abnormality determination and application circuit selection) that, for example, stops the opening/closing circuit unit with an abnormality from being utilized and replaces it by an auxiliary circuit. The monitoring control circuit unit 130B has the opening/closing signal selection circuit and distributes the opening/closing signals for operation to the opening/closing circuit units that are designated as the application circuits (opening/closing signal distribution). The kinds of opening/closing signals include the common opening/closing signal S00 for concurrently opening/closing the upper and lower opening/closing devices in conjunction with the logic operation of the load driving command Son, the effective opening/closing signal S01 for closing in a delayed manner and then opening instantaneously, the ineffective opening/closing signal S10 for closing instantaneously and then opening in a delayed manner, and the like. The outside monitoring circuit unit 190B supplies the calculation control circuit unit 120B with an excessive-current abnormality determination signal and the monitoring signal (potential level determination signal) for determining whether or not there exists a short-to-power abnormality or a short-to-ground abnormality in the load wiring lead or whether or not there exists a short-circuit abnormality or a disconnection abnormality in the electric load (outside monitoring).

Figure 14A:
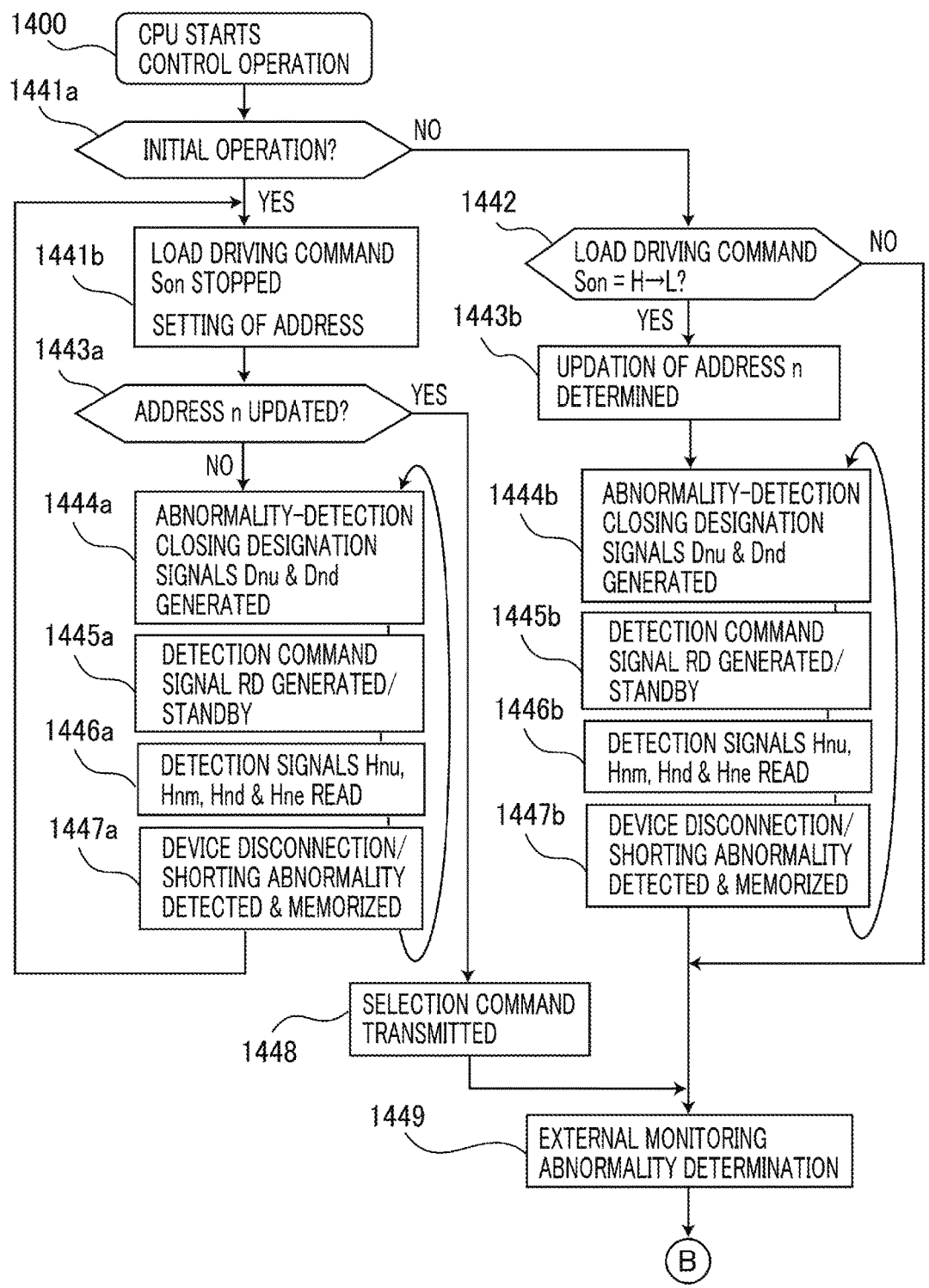
FIG. 14A is the former stage portion of a flowchart for explaining the operation of a calculation control circuit unit in FIG. 12.
Figure 14B:
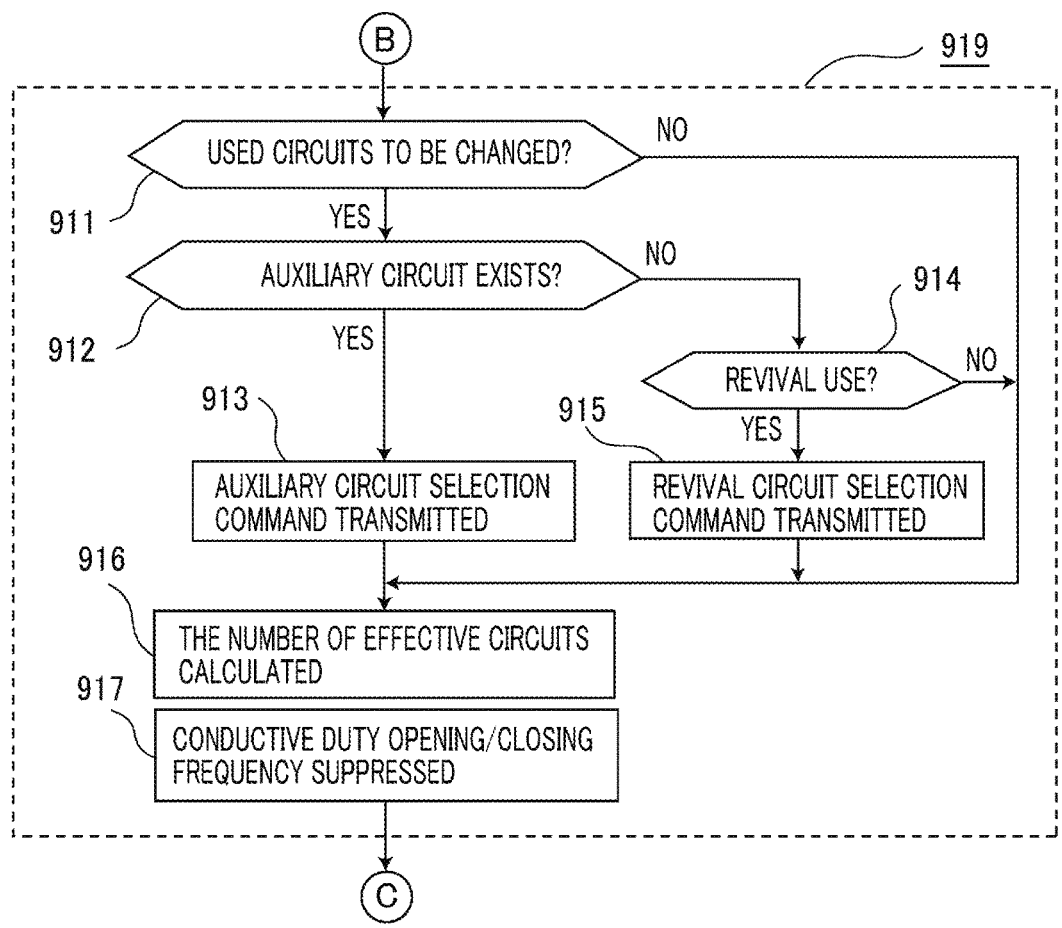
FIG. 14B is the middle stage portion of the flowchart for explaining the operation of the calculation control circuit unit in FIG. 12.
Figure 14C:
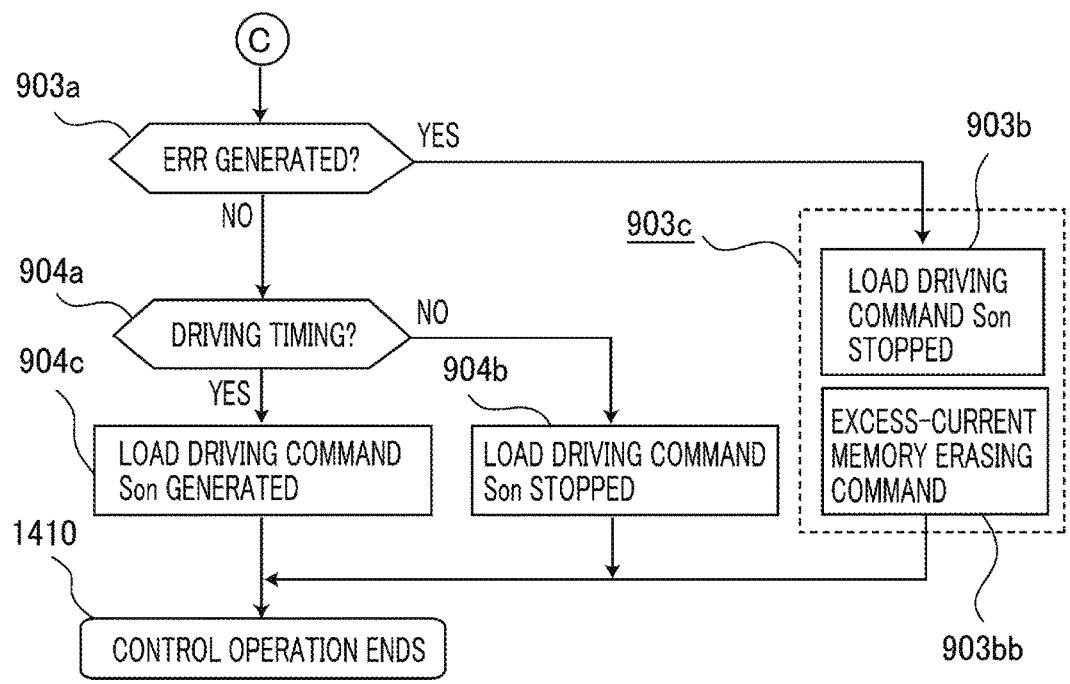
FIG. 14C is the latter stage portion of the flowchart for explaining the operation of the calculation control circuit unit in FIG. 12.

In FIG. 14A, the process 1400 is an operation starting process of the microprocessor CPU. In the process 1441a, which is a determination step, it is determined whether or not the present process is the initial passing process after the start of the operation; in the case where the present process is the initial passing process, the result of the determination becomes "YES", and the process 1441a is followed by the process 1441b; in the case where the present process is not the initial passing process, the result of the determination becomes "NO", and the process 1441a is followed by the process 1442. The process 1441b is a step in which the load driving command Son is stopped (the logic level thereof is made "L") so that the simultaneous inspection of the opening/closing device integrated circuit 200B is started through the monitoring control circuit unit 130B and in which the address designation data ADR for the opening/closing circuit unit to be inspected is set; the process 1441b is followed by the process 1443a. In the process 1443a, which is a determination step, it is determined whether or not the updation setting of the address number (n=40, 50, 60, . . . ) in the process 1441b has been completed; in the case where the updation setting has been completed, the result of the determination becomes "YES" and the process 1443a is followed by the process 1448; in the case where the updation setting has not been completed, the result of the determination becomes "NO" and the process 1443a is followed by the process 1444a. In the process 1444a, the upper-side and lower-side circuit closing specification signals Dnu and Dnd in FIG. 13 are set to the first mode (L, L) and are transmitted to the opening/closing circuit unit through the output destination selection circuit SEnw. In the process 1445a, the logic of the detection command signal RD is changed from "L" to "H"; in the process 1446a, the potential level determination signals Hnu, Hnm, and Hnd transmitted upstream from the input/output destination selection circuit SEn in response to the detection command signal RD are read; then, the process 1446a is followed by the process 1447a, where it is determined and stored whether or not there exists an abnormality when the upper-side and lower-side circuit closing specification signals (Dnu, Dnd) are (L, L).

In the processes 1444a through 1447a, the combination of the upper-side and lower-side circuit closing specification signals (Dnu, Dnd) is changed so that it is determined and stored whether or not there exists an abnormality in each of the second and third modes; then, the process 1441b is resumed, where the address designation data ADR is changed; it is sequentially determined whether or not there exists a short-circuit abnormality or a disconnection abnormality in each of the upper and lower opening/closing devices Tnu and Tnd in the opening/closing circuit unit UBn; then, when the abnormality determination on all the opening/closing circuit units is completed, the result of the determination in the process 1443a becomes "YES" and the process 1443a is followed by the process 1448. The logics of the determination on whether or not an abnormality exists are as represented in FIGS. 8B through 8D. In the process 1448, based on the address designation data ADR for designating the input/output destination selection circuit SEn (n=1, 2, 3, . . . ) in FIG. 13, the setting command signal WR, and the 2-bit selection command signal, the upper-side and lower-side opening/closing timing signals Snu and Snd for the upper and lower-side opening/closing devices Tnu and Tnd in each of the opening/closing circuit units are transmitted; then, the process 1448 is followed by the process 1449. The contents of the opening/closing timing signal, for each of the opening/closing devices, transmitted through the selection command signal are as represented in FIG. 5B. The description hereto relates to a simultaneous inspection at a time when the operation is started; however, at a time of the operation, each time the load driving command Son is stopped in the processes 1442 through 1447b, the plurality of opening/closing circuit units UBn are inspected one by one.

In the process 1442, which is a determination step, it is determined whether or not the load driving command Son has been stopped (the logic level has changed from "H" to "L"); in the case the load driving command Son has been stopped, the result of the determination becomes "YES" and the process 1442 is followed by the process 1443b; in the case where the load driving command Son is working or being stopped, the result of the determination becomes "NO" and the process 1442 is followed by the process 1449. In the process 1443b, each time the logic of the load driving command Son changes from "H" to "L", the address designation data ADR is updated. The processes 1444b through 1447b are the same as the processes 1444a through 1447a for the simultaneous inspection; the three-mode abnormality inspection on the opening/closing circuit units having preliminarily designated addresses is implemented, and then, it is detected and stored whether or not an abnormality has occurred. The process 1449 following the process 1447b is a step in which the logic states of the potential level determination signals H90u, H90m, and H90d generated by the outside monitoring circuit unit 190B are compared with the generation states of the opening/closing signals for the respective opening/closing circuit units and in which based on the determination logics represented in FIG. 8A, it is determined whether or not there exists a short-to-power abnormality or a short-to-ground abnormality in the positive-side load wiring lead 102u or whether or not there exists a disconnection or short-circuit abnormality in the load; the process 1449 is followed by the process 911 in FIG. 14B by way of the relay terminal B.

In FIG. 14B, in the process 911, which is a determination step, in the case where in response to the state, of the opening/closing device integrated circuit 200B, that has been read in the processes 1444b through 1447b, the application circuit is changed, the result of the determination becomes "YES" and then the process 911 is followed by the process 912; in the case where the application circuit is not changed, the result of the determination becomes "NO" and then the process 911 is followed by the process 916. In the process 912, which is a determination step, in the case where there exists an auxiliary circuit, the result of the determination becomes "YES", then the process 912 is followed by the process 913; in the case where there exists no auxiliary circuit, the result of the determination becomes "NO", then the process 912 is followed by the process 914. In the process 913, the kinds of the opening/closing signals for the lower-side opening/closing timing signal Snd and the upper-side opening/closing timing signal Snu are specified by means of the input/output destination selection circuit SEn represented in FIG. 13; then, the process 913 is followed by the process 916. In the process 914, which is a determination step, it is determined whether or not the partially broken opening/closing circuit unit in which one of the upper and lower opening/closing devices is short-circuited and the other one thereof is normal should be utilized in a revival manner; in the case where the partially broken opening/closing circuit unit is utilized in a revival manner, the result of the determination becomes "YES" and then the process 914 is followed by the process 915; in the case where the partially broken opening/closing circuit unit is not utilized in a revival manner, the result of the determination becomes "NO" and then the process 914 is followed by the process 916. In the process 915, the kinds of the opening/closing signals for the lower-side opening/closing timing signal Snd and the upper-side opening/closing timing signal Snu are specified by means of the input/output destination selection circuit SEn represented in FIG. 13; then, the process 915 is followed by the process 916. The process 916 is a step in which the number of effective opening/closing circuit units that are currently selected as the application circuits is calculated and that is followed by the process 917.

The process 917 is a step in which when the number of utilized opening/closing circuit units is smaller than an appropriate number, the conduction duty rate of the load driving command Son is suppressed or the on/off frequency of the load driving command Son is suppressed and that is followed by the process 903a in FIG. 14C by way of the relay terminal C. The process block 919 including processes 911 through 917 is the application circuit selection means; the process 913 is an auxiliary circuit selection means, the process 915 is a revival circuit selection means; the process 917 is a conduction suppression means; each of the revival circuit selection means 915 and the conduction suppression means 917 is utilized as an emergency operation means in an abnormal situation.

In FIG. 14C, in the process 903a, which is a determination step, it is determined whether or not the excessive-cur rent detection signal ERR, which is an interruption signal generated by the outside monitoring circuit unit 190B, has occurred; in the case where the excessive-current detection signal ERR has been received, the result of the determination becomes "YES" and the process 903a is followed by the process 903b; in the case where the excessive-current detection signal ERR has not been received, the result of the determination becomes "NO" and the process 903a is followed by the process 904a. In the process 903b, the load driving command Son is stopped, and in the process 903bb, the reset command RST is generated so that the excessive-current occurrence memory circuit 198c in the outside monitoring circuit unit 190B is reset; then, the process 903bb is followed by the operation ending process 1410. The process block 903c including the process 903b and the process 903bb is an abnormality occurrence processing means. In the process 904a, in response to the operation state of an unillustrated outside sensor or the like, it is determined whether or not the present timing is the timing for generating the load driving command Son; in the case where the present timing is not the timing for generating the load driving command Son, the result of the determination becomes "NO" and the process 904a is followed by the process 904b, where the logic level of the load driving command Son is made "L"; in the case where the present timing is the timing for generating the load driving command Son, the result of the determination becomes "YES" and the process 904a is followed by the process 904c, where the logic level of the load driving command Son is made "H"; then, the process 904c is followed by the operation ending process 1410. In the operation ending process 1410, other control programs are implemented and then, the operation starting process 1400 in FIG. 14A is resumed within a predetermined time period; the following control programs are implemented in a repeated manner.

Figure 15:
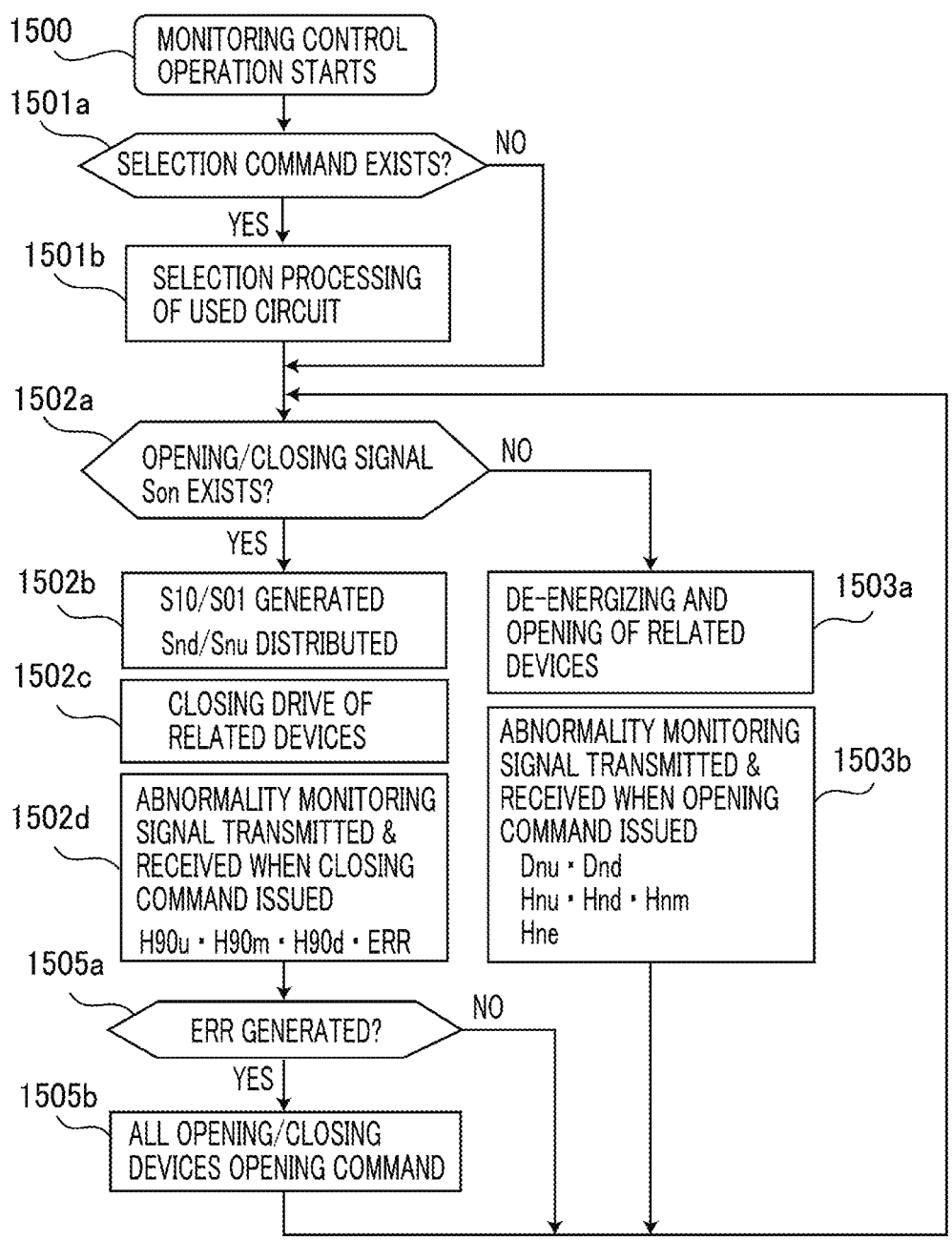
FIG. 15 is a flowchart for explaining the operation of the monitoring control circuit unit in FIG. 12.

In FIG. 15, the process 1500 is a step in which when the power-source voltage Vbb is applied to the opening/closing device integrated circuit 200B, the monitoring control circuit unit 130B starts its operation; however, the monitoring control circuit unit 130B is configured with a logic circuit that does not include any microprocessor. The flowchart, explained hereinafter, equivalently represents the operation and action of the logic circuit. In the process 1501a, it is determined whether or not there exists the selection command based on the selection command signal produced through the process 1448 in FIG. 14A or the processes 913 and 915 in FIG. 14B; in the case where the selection command exists, the result of the determination becomes "YES" and the process 1501a is followed by the process 1501b; in the case where the selection command does not exist, the result of the determination becomes "NO" and the process 1501a is followed by the process 1502a. In the process 1501b, the selection gates of the opening/closing signal selection circuit 132aa in FIG. 13 are made to operate by use of the input/output destination selection circuit SEn in FIG. 13; then, the process 1501b is followed by the process 1502a. In the process 1502a, which is a determination step, in the case where the load driving command Son is the circuit-closing command (logic "H"), the result of the determination becomes "YES" and the process 1502a is followed by the process 1502b; in the case where the load driving command Son is the circuit-opening command (logic "L"), the process 1502a is followed by the process 1503a.

The process 1502b is a step in which through the non-selection opening command, the ineffective on/off command circuit 133b, the effective on/off command circuit 133c, and the common opening/closing command in FIG. 13, the circuit-opening command signal, the ineffective opening/closing signal S10, the effective opening/closing signal S01, and the common opening/closing signal S00 are generated, and these generated signals are distributed into the upper-side and lower-side opening/closing timing signals Snu and Snd by the opening/closing signal selection circuit 132aa. In the process 1502c, the opening/closing command signals generated in the process 1502b are provided to the upper and lower opening/closing devices distributed in the process 1502b and hence circuit-closing driving of the related opening/closing devices is performed; then, the process 1502c is followed by the process 1502d. In the process 1502d, the outside monitoring circuit unit 190B transmits the potential level determination signals H90u, H90m, and H90d and the excessive-current detection signal ERR directly to the calculation control circuit unit 120B. In the process 1505a, which is a determination step, it is determined whether or not the outside monitoring circuit unit 190B has generated the excessive-current detection signal ERR; in the case where an abnormality has occurred, the result of the determination becomes "YES" and the process 1505a is followed by the process 1505b; in the case where no abnormality has occurred, the result of the determination becomes "NO" and the process 1502a is resumed. In the process 1505b, all the opening/closing command signals are changed to the circuit-opening commands; then, the process 1502a is resumed. The process 1005b functions as an abnormality occurrence treating means.

In the process 1503a, the related opening/closing devices are instantaneously or in a delayed manner de-energized and opened; then, the process 1503a is followed by the process 1503b. In the process 1503b, in accordance with the simultaneous inspection processes 1444a through 1447a and the separate processes 1444b through 1447b in FIG. 14A, reception of the circuit-opening specification signals Dnu and Dnd and transmission of the potential level determination signals Hnu, Hnm, and Hnd and the current detection signal Hne are performed; then the process 1502a is resumed. In the foregoing explanation, with regard to the signal communication between the calculation control circuit unit and the integrated circuit device and the contents thereof, only a single preferred example has been described; however, any one of various variant modes can replace it. The application classifications A through D represented in FIGS. 5B and 13 do not include the special circuit-closing signal S11 represented in FIG. 11 and there is included no signal for fixing the opening/closing device in a sort-circuit abnormality state to the circuit-opening command or the circuit-closing command; however, in the case of Embodiment 1, the number of bits of the series command signal SER in FIG. 5B is increased or in the case of Embodiment 2, the logics of the signals A through D in the downstream line are combined, so that the number of the application classifications can be increased.

(3) Gist and Feature of Embodiment 2

As is clear from the foregoing explanation, the load-driving integrated circuit device 110B according to Embodiment 2 of the present invention has the calculation control circuit unit 120B that generates the load driving command Son, which is a command signal for applying the power-source voltage Vbb to the electric load 100, the opening/closing device unit that is connected in series with the positive-side load wiring lead 102u of the electric load 100 and has a plurality of semiconductor opening/closing devices, the monitoring control circuit unit 130B that makes the plurality of semiconductor opening/closing devices perform opening/closing operation in response to the load driving command Son; and the opening/closing device integrated circuit 200B in which the opening/closing device unit and the monitoring control circuit are integrated on a semiconductor chip; the opening/closing device unit has a plurality of opening/closing circuit units UBn (n=40, 50, 60, . . . ) which are equal to or more than three opening/closing circuit units of the first opening/closing circuit unit 140B, the second opening/closing circuit unit 150B, and the third opening/closing circuit unit 160B, which are connected in parallel with one another.

Each of the plurality of opening/closing circuit units UBn has upper and lower opening/closing devices which form a pair of upper-side opening/closing device T40u•T50u•T60u (hereinafter, described as Tnu) and lower-side opening/closing device T40d•T50d•T60d (hereinafter, described as Tnd) which are connected in series with each other, and the connection point potential detection circuit 146•156•166 that generates an output voltage corresponding to the potential of the connection point between the upper-side opening/closing device Tnu and the lower-side opening/closing device Tnd; the calculation control circuit unit 120B has the application circuit selection means 919 that selects application circuits, which are opening/closing circuit units for performing on/off operation of the load current corresponding to the load driving command Son, from the plurality of opening/closing circuit units UBn; in the case where it is determined based on the output voltage of the connection point potential detection circuit 146•156•166 that a disconnection abnormality or a short-circuit abnormality has occurred in the upper-side opening/closing device Tnu or the lower-side opening/closing device Tnd, the application circuit selection means 919 removes an opening/closing circuit unit, in which an abnormality has occurred, from the application circuits, and includes an auxiliary circuit, which is a normal opening/closing circuit unit that has not been selected as the application circuit, in the application circuits in the case where there is the auxiliary circuit; the monitoring control circuit unit 130B has the opening/closing signal selection circuit 132aa that distributes the opening/closing command signals corresponding to the load driving command Son into the upper and lower opening/closing devices of the application circuit selected by the application circuit selection means 919.

The opening/closing signal selection circuit 132aa provides the upper-side opening/closing timing signal Snu and the lower-side opening/closing timing signal Snd, which are the common opening/closing signals S00 generated at the same timing in response to the load driving command Son, to the upper and lower opening/closing devices Tnu and Tnd of the application circuit. Alternatively, the opening/closing signal selection circuit 132aa is provided with the effective on/off command circuit 133cc that generates the effective opening/closing signal S01 which performs delayed closing and instantaneous opening of one of the upper and lower opening/closing devices Tnu and Tnd of the application circuit in response to the logic level of the load driving command Son, or generates the effective opening/closing signal S01 with which one of the upper and lower opening/closing devices Tnu and Tnd of the application circuit becomes an opening state at least when the other one of the upper and lower opening/closing devices Tnu and Tnd of the application circuit performs opening/closing operation; and the ineffective on/off command circuit 133bb that generates the ineffective opening/closing signal S10 which performs instantaneous closing and delayed opening of the other one of the upper and lower opening/closing devices Tnu and Tnd of the application circuit in response to the logic level of the load driving command Son, or generates the ineffective opening/closing signal S10 with which the other one of the upper and lower opening/closing devices Tnu and Tnd of the application circuit performs opening/closing operation at least in a period in which one of the upper and lower opening/closing devices Tnu and Tnd of the application circuit is opened; the ineffective opening/closing signal S10 becomes the upper-side opening/closing timing signal Snu or the lower-side opening/closing timing signal Snd which is generated for one of the upper and lower opening/closing devices Tnu and Tnd of the application circuit; the effective opening/closing signal S01 becomes the upper-side opening/closing timing signal Snu or the lower-side opening/closing timing signal Snd which is generated for the other one of the upper and lower opening/closing devices of the application circuit.

As described above, with regard to claim 2 of the present invention, there are provided the ineffective on/off command circuit and the effective on/off command circuit; when one of the upper-side opening/closing device and the lower-side opening/closing device that are connected in series with each other performs on/off operation of the load current, the other one thereof is closed or the common opening/closing signal for performing simultaneous on/off operation of the load current is provided to the upper and lower opening/closing devices. Thus, there is demonstrated a characteristic the same as that of Embodiment 1.

Each of the plurality of opening/closing circuit units UBn has the upper-side parallel resistor 144u•154u•164u for the upper-side opening/closing device Tnu, the lower-side parallel resistor 144d•154d•164d for the lower-side opening/closing device Tnd, and the connection point potential detection circuit 146•156•166 that detects the potential of the connection point between the upper-side opening/closing device Tnu and the lower-side opening/closing device Tnd; the output voltage of the connection point potential detection circuit 146•156•166 is a preliminarily set value that differs corresponding to a closing state in which only one of the upper and lower opening/closing devices Tnu and Tnd is closed, a closing state in which only the other one thereof is closed, or an opening state in which both thereof are opened; the calculation control circuit unit 120B has the abnormality detection means 1447a•1447b; the abnormality detection means 1447a•1447b compares the state of the opening/closing command for the upper or lower opening/closing device Tnu•Tnd with the state of the output voltage of the connection point potential detection circuit 146•156•166 so as to separately determine whether or not a device disconnection abnormality or a device snort-circuit abnormality exists in the upper-side opening/closing device Tnu and/or the lower-side opening/closing device Tnd.

As described above, with regard to claim 6 of the present invention, each of the plurality of opening/closing circuit units has the upper-side parallel resistor, the lower-side parallel resistor, and the connection point potential detection circuit; the calculation control circuit unit has an abnormality detection means, for a time when the circuit-opening command is issued, that compares the states of the command signals for the plurality of opening/closing circuit units with state signals obtained from the respective connection point potential detection circuits of the corresponding opening/closing circuit units so as to separately detect whether or not a short-circuit abnormality or a disconnection abnormality exists in each of the respective opening/closing devices in the opening/closing circuit units. Thus, there is demonstrated a characteristic the same as that of Embodiment 1.

There is further provided the outside monitoring circuit unit 190B that monitors the ground potential of the positive-side load wiring lead 102$u$, which is connected with the power-source voltage Vbb by way of the pull-up circuit 103$u$ and connected with the ground circuit GND by way of the pull-down circuit 103$d$; the outside monitoring circuit unit 190B has the wiring lead potential detection circuit 196 that generates an output voltage corresponding to the ground potential of the positive-side load wiring lead 102$u$ in the resistor circuit including the pull-up circuit 103$u$, the pull-down circuit 103$d$, the series circuit consisting of the upper-side parallel resistor 144$u$•154$u$•164$u$ and the lower-side parallel resistor 144$d$•154$d$•164$d$ of each of the plurality of opening/closing circuit units UBn connected in parallel with the pull-up circuit 103$u$ or the pull-down circuit 103$d$; the calculation control circuit unit 120B has the outside monitoring abnormality determination means 1449 that compares the state of the load driving command Son for the electric load 100 with the output voltage of the wiring lead potential detection circuit 196 so as to separately or integrally determine whether or not there exists a short-to-ground abnormality in which the positive-side load wiring lead 102$u$ makes mixture contact with the ground circuit GND or a load short-circuit abnormality, whether or not there exists a short-to-power abnormality in which the positive-side load wiring lead 102$u$ makes mixture contact with the power-source wiring lead 102P, and whether or not there exists a load disconnection abnormality including a disconnection of the positive-side load wiring lead 102$u$ or an internal disconnection of the electric load 100.

The outside monitoring circuit unit 190B further has the excessive-current detection circuit 198$a$ and the excessive-current occurrence memory circuit 198$c$; when the composite detection voltage obtained by adding the respective voltages across the distribution resistors 147$a$, 157$a$, and 167$a$ provided in the plurality of opening/closing circuit units UBn exceeds the excessive-current detection voltage 198$b$ preliminarily set in accordance with a maximum load current flowing in the electric load 100, the excessive-current detection circuit 198$a$ sets the excessive-current occurrence memory circuit 198$c$ so as to make the excessive-current occurrence memory circuit 198$c$ generate the excessive-current detection signal ERR; the monitoring control circuit unit 130B has the abnormality occurrence treating means 1505$b$; the calculation control circuit unit 120B has the abnormality occurrence processing means 903$c$; when the excessive-current detection signal ERR occurs, the abnormality occurrence treating means 1505$b$ stops the circuit-closing command signals for all the upper-side opening/closing devices Tnu and all the lower-side opening/closing devices Tnd in the plurality of opening/closing circuit units; when the excessive-current detection signal ERR occurs, the abnormality occurrence processing means 903$c$ stops the load driving commands Son for all the plurality of opening/closing circuit units UBn and then generates the reset command RST for the excessive-current occurrence memory circuit 198$c$.

As described above, with regard to claim 8 of the present invention, in response to the composite voltage of the current detection voltages obtained through the respective distribution resistors provided in the plurality of opening/closing circuit units, the excessive-current detection circuit and the excessive-current occurrence memory circuit provided in the outside monitoring circuit unit detect and memorize the occurrence of an excessive current abnormality caused by a short-circuit abnormality or the like in the electric load and then stop the circuit-closing commands for all the opening/closing devices through the calculation control unit and the monitoring control circuit unit. Thus, there is demonstrated a characteristic the same as that of Embodiment 1.

The calculation control circuit unit 120B includes the program memory PMEM and the microprocessor CPU that collaborates with the program memory PMEM, and is provided with a serial data line for performing upstream and downstream communication of multi-bit serial data SED with the monitoring control circuit unit 130B by setting the microprocessor CPU as a master station; the calculation control circuit unit 120B has the abnormality determination processing unit and is provided with an abnormality-determination circuit-closing specification signal generation means 1444$a$•1444$b$ that sequentially issues a circuit-opening command for opening both the upper and lower opening/closing devices Tnu and Tnd, a circuit-closing command for generating the upper-side circuit closing specification signal D40$u$•D50$u$•D60$u$ (hereinafter, described as Dnu) which closes only the upper-side opening/closing device Tnu, and a circuit-closing command for generating the lower-side circuit closing specification signal D40$d$•D50$d$•D60$d$ (hereinafter, described as Dnd) which closes only the lower-side opening/closing device Tnd, when the load driving command Son is the circuit-opening command; the serial data SED includes the address designation data ADR for specifying to which opening/closing circuit unit among the plurality of opening/closing circuit units 140B, 150B, and 160B the right of communication is provided, a 2-bit selection command signal transmitted downstream in response to the setting command signal WR set by the microprocessor CPU, a 4-bit monitoring reporting signal transmitted upstream in response to the detection command signal RD set by the microprocessor CPU, and the upper-side circuit closing specification signal Dnu and the lower-side circuit closing specification signal Dnd transmitted downstream through a 2-bit dedicated line.

The selection command signal is a command signal that specifies which opening/closing device out of the upper and lower opening/closing devices Tnu and Tnd is set for a circuit-opening command, specifies to which opening/closing device the effective opening/closing signal S01 or the common opening/closing signal S00 is provided, and specifies to which opening/closing device the ineffective opening/closing signal S10 or the common opening/closing signal S00 is provided, and the selection command signal is inputted to the opening/closing signal selection circuit 132$aa$; the monitoring reporting signal includes the potential level determination signal H40$u$•H40$m$•H40$d$, H50$u$•H50$m$•H50$d$, H60$u$•H60$m$•H60$d$ (hereinafter described as Hnu, Hnm, Hnd) generated by the connection point potential detection circuit 146•156•166; the program memory PMEM includes a control program that functions as the abnormality detection means 1447a•1447b which, when the load driving command Son is a circuit-opening command, compares the state of an opening/closing command for the upper and lower opening/closing devices Tnu•Tnd with the logic state of the potential level determination signal Hnu, Hnm, Hnd at a time when a circuit-opening command for opening both the upper and lower opening/closing devices Tnu and Tnd, a circuit-closing command for closing only the upper-side opening/closing device Tnu, and a circuit-closing command for closing only the lower-side opening/closing device Tnd are sequentially issued, and separately determines whether or not there exists a short-circuit abnormality and a disconnection abnormality in each of all the opening/closing devices; the program memory PMEM includes a control program that functions as the application circuit selection means which determines selection of the application circuit from the plurality of opening/closing circuit units 140B, 150B, 160B, based on the abnormality determination information.

As described above, with regard to claim 10 of the present invention, when the electric load is not driven, the monitoring control circuit unit transmits a potential level determination signal at a time when a circuit-opening command for opening both the upper-side opening/closing device and the lower-side opening/closing device in a pair, a circuit-closing command for closing only the upper-side opening/closing device, and a circuit-closing command for closing only the lower-side opening/closing device are sequentially issued; the calculation control circuit unit compares the opening/closing command signal transmitted to the monitoring control circuit unit with the potential level determination signal returned from the monitoring control circuit unit so as to sequentially and separately determine whether or not there exists a short-circuit abnormality or a disconnection abnormality in each of the opening/closing devices, and then determines which one of the plurality of opening/closing circuit units is selected as an application circuit. Thus, the hardware configuration of the monitoring control circuit unit is simplified and there is demonstrated a characteristic that because the calculation control circuit unit sequentially performs an abnormality determination on any one of the plurality of opening/closing circuit units each time the drive command signal is cancelled, the rapid control load is reduced.

In the scope of the present invention, the embodiments thereof can freely be combined with one another and can appropriately be modified or omitted.

What is claimed is:
1. A load-driving integrated circuit device comprising:
a calculation control circuit unit that generates a load driving command Son that is a command signal for applying a power-source voltage to an electric load;
an opening/closing device unit that is connected in series with a negative-side load wiring lead or a positive-side load wiring lead of the electric load and has a plurality of semiconductor opening/closing devices;
a monitoring control circuit unit that makes the plurality of semiconductor opening/closing devices perform opening/closing operation in response to the load driving command Son; and
an opening/closing device integrated circuit in which the opening/closing device unit and the monitoring control circuit unit are integrated on a semiconductor chip,
wherein the opening/closing device unit has a plurality of opening/closing circuit units which are equal to or more than three opening/closing circuit units of a first opening/closing circuit unit, a second opening/closing circuit unit, and a third opening/closing circuit unit, which are connected in parallel with one another,
wherein each of the plurality of opening/closing circuit units has upper and lower opening/closing devices which form a pair of upper-side opening/closing device and lower-side opening/closing device which are connected in series with each other, and a connection point potential detection circuit that generates an output voltage corresponding to the potential of the connection point between the upper-side opening/closing device and the lower-side opening/closing device,
wherein the calculation control circuit unit has an application circuit selection calculator that selects an application circuit, which is an opening/closing circuit unit for performing on/off operation of a load current corresponding to the load driving command Son, from the plurality of opening/closing circuit units; in the case where it is determined based on an output voltage of the connection point potential detection circuit that a device disconnection abnormality or a device snort-circuit abnormality has occurred in the upper-side opening/closing device or the lower-side opening/closing device, the application circuit selection calculator removes an opening/closing circuit unit, in which an abnormality has occurred, from the application circuit, and includes an auxiliary circuit, which is a normal opening/closing circuit unit which is not selected as the application circuit, in the application circuit in the case where there is the auxiliary circuit, and
wherein the monitoring control circuit unit has an opening/closing signal selection circuit that distributes opening/closing command signals corresponding to the load driving command Son into the upper and lower opening/closing devices of the application circuit selected by the application circuit selection calculator.

2. The load-driving integrated circuit device according to claim 1,
wherein the opening/closing signal selection circuit provides an upper-side opening/closing timing signal and a lower-side opening/closing timing signal, which are common opening/closing signals S00 generated at the same timing in response to the load driving command Son, to the upper and lower opening/closing devices of the application circuit,
alternatively, the opening/closing signal selection circuit is provided with an effective on/off command circuit that generates an effective opening/closing signal S01 which performs delayed closing and instantaneous opening of one of the upper and lower opening/closing devices of the application circuit in response to a logic level of the load driving command Son, or generates the effective opening/closing signal S01 with which one of the upper and lower opening/closing devices of the application circuit becomes an opening state at least when the other one of the upper and lower opening/closing devices of the application circuit performs opening/closing operation; and an ineffective on/off command circuit that generates an ineffective opening/closing signal S10 which performs instantaneous closing and delayed opening of the other one of the upper and lower opening/closing devices of the application circuit in response to the logic level of the load driving command Son, or generates the ineffective opening/ closing signal S10 with which the other one of the upper and lower opening/closing devices of the application circuit performs opening/closing operation at least in a period in which one of the upper and lower opening/closing devices of the application circuit is opened, and wherein the ineffective opening/closing signal S10 becomes the upper-side opening/closing timing signal or the lower-side opening/closing timing signal which is generated for one of the upper and lower opening/closing devices of the application circuit, and the effective opening/closing signal S01 becomes the upper-side opening/closing timing signal or the lower-side opening/closing timing signal which is generated for the other one of the upper and lower opening/closing devices of the application circuit.

3. The load-driving integrated circuit device according to claim 2, wherein the opening/closing signal selection circuit sets both the upper-side opening/closing timing signal and the lower-side opening/closing timing signal for the upper and lower opening/closing devices in the auxiliary circuit, which is not selected as the application circuit, to the circuit-opening command or to a special circuit-closing signal S11 for closing later than closing of the effective opening/closing signal S01, and opening earlier than opening of the effective opening/closing signal S01, and wherein after the auxiliary circuit is selected as the application circuit, the opening/closing signal selection circuit switches the opening/closing timing signal for one of the upper and lower opening/closing devices to the ineffective opening/closing signal S10 and switches the opening/closing timing signal for the other one thereof to the effective opening/closing signal S01.

4. The load-driving integrated circuit device according to claim 2, wherein the application circuit selection calculator has a revival circuit selection calculator that selects an opening/closing circuit unit whose upper and lower opening/closing devices are normal, as the application circuit, that selectively removes a disconnection opening/closing circuit unit, in which at least one of the upper and lower opening/closing devices has a device disconnection abnormality, from the application circuit; and that selects in a revival manner a partially broken opening/closing circuit unit, in which one of the upper and lower opening/closing devices has a device short-circuit abnormality and the other one thereof is normal, as the application circuit, wherein the opening/closing signal selection circuit provides the ineffective opening/closing signal S10 to one of the upper and lower opening/closing devices of the application circuit selected by the application circuit selection calculator and provides the effective opening/closing signal S01 to the other one of the upper and lower opening/closing devices of the application circuit, and wherein before the revival selection, both the upper-side and lower-side opening/closing timing signals are set to the circuit-opening command, and then, after the revival selection, in response to the revival circuit selection calculator, the opening/closing signal selection circuit provides the effective opening/closing signal S01 to any normal one of the upper and lower opening/closing devices and provides a circuit-opening command signal, a circuit-closing command signal, or the ineffective opening/closing signal S10 to the other one, of the upper and lower opening/closing devices, which has a short-circuit abnormality.

5. The load-driving integrated circuit device according to claim 2, wherein the calculation control circuit unit includes an effective circuit number calculator and a conduction suppression calculator, wherein the effective circuit number calculator calculates the effective number of effective opening/closing circuit units, each of which is selected as the application circuit by the application circuit selection calculator and is performing normal operation, wherein when the effective number calculated by the effective circuit number calculator is smaller than an appropriate number, the conduction suppression calculator applies subtraction correction to a conduction duty rate, which is the proportion of the circuit-closing time of the effective opening/closing signal to the opening/closing period thereof, or an opening/closing frequency, in accordance with the proportion of the effective number to the appropriate number, and wherein the appropriate number is preliminarily set to the number of opening/closing circuit units to be selected as the application circuits when no selective removal due to abnormality determination exists.

6. The load-driving integrated circuit device according to claim 2, wherein each of the plurality of opening/closing circuit units has an upper-side parallel resistor for the upper-side opening/closing device, a lower-side parallel resistor for the lower-side opening/closing device, and the connection point potential detection circuit that detects the potential of the connection point between the upper-side opening/closing device and the lower-side opening/closing device, wherein the output voltage of the connection point potential detection circuit is a preliminarily set value that differs corresponding to a closing state in which only one of the upper and lower opening/closing devices is closed, a closing state in which only the other one thereof is closed, or an opening state in which both thereof are opened, wherein the monitoring control circuit unit or the calculation control circuit unit has an abnormality determination processing device or an abnormality detection calculator, and wherein the abnormality determination processing device or the abnormality detection calculator compares the state of the opening/closing command for the upper and lower opening/closing devices with the state of the output voltage of the connection point potential detection circuit so as to separately determine whether or not a device disconnection abnormality or a device short-circuit abnormality exists in the upper-side opening/closing device and the lower-side opening/closing device.

7. The load-driving integrated circuit device according to claim 6, wherein each of the plurality of opening/closing circuit units has a distribution resistor further connected in series with the upper and lower opening/closing devices, wherein the distribution resistor is a wiring-lead resistor provided on the semiconductor chip or a bonding wire connecting an electrode pad provided on the semiconductor chip with an external connection terminal provided outside the semiconductor chip, wherein each of the resistance value of the distribution resistor and the bonding wire has a positive temperature coefficient with which the resistance value thereof increases as the temperature rises, and wherein the distribution resistor is a thin-wire resistor that is heated and melted by a load current when all of the load current in the electric load continuously flows in any one of the plurality of the distribution resistors.

8. The load-driving integrated circuit device according to claim 7, further comprising an outside monitoring circuit unit that monitors the ground potential of the negative-side load wiring lead or the positive-side load wiring lead, which is connected with the power-source voltage by way of a pull-up circuit and connected with the ground circuit by way of a pull-down circuit, wherein the outside monitoring circuit unit has a wiring lead potential detection circuit that generates an output voltage corresponding to the ground potential of the negative-side load wiring lead or the positive-side load wiring lead in a resistor circuit including the pull-up circuit, the pull-down circuit, the series circuit consisting of the upper-side parallel resistor and the lower-side parallel resistor of each of the plurality of opening/closing circuit units connected in parallel with the pull-up circuit or the pull-down circuit, wherein the monitoring control circuit unit or the calculation control circuit unit has an outside monitoring abnormality determination calculator that compares the state of the load driving command Son for the electric load with the output voltage of the wiring lead potential detection circuit so as to separately or integrally determine whether or not there exists a short-to-power abnormality in which the negative-side load wiring lead makes mixture contact with the power-source wiring lead or a load short-circuit abnormality, whether or not there exists a short-to-ground abnormality in which the positive-side load wiring lead makes mixture contact with the ground circuit or a load short-circuit abnormality, whether or not there exists a short-to-ground abnormality in which the negative-side load wiring lead makes mixture contact with the ground circuit, whether or not there exists a short-to-power abnormality in which the positive-side load wiring lead makes mixture contact with the power-source wiring lead, and whether or not there exists a load disconnection abnormality including an internal disconnection of the electric load, or a disconnection of the negative-side load wiring lead or the positive-side load wiring lead, wherein the outside monitoring circuit unit further has an excessive-current detection circuit and an excessive-current occurrence memory circuit, wherein when the composite detection voltage obtained by adding the respective voltages across the distribution resistors provided in the plurality of opening/closing circuit units exceeds an excessive-current detection voltage preliminarily set in accordance with a maximum load current flowing in the electric load, the excessive-current detection circuit sets the excessive-current occurrence memory circuit so as to make the excessive-current occurrence memory circuit generate an excessive-current detection signal ERR, wherein the monitoring control circuit unit has also an abnormality occurrence treating calculator, wherein the calculation control circuit unit has an abnormality occurrence processing calculator, wherein when the excessive-current detection signal ERR occurs, the abnormality occurrence treating calculator stops the circuit-closing command signals for all the upper-side opening/closing devices and all the lower-side opening/closing devices in the plurality of opening/closing circuit units, and wherein when the excessive-current detection signal ERR occurs, the abnormality occurrence processing calculator stops the load driving commands Son for all the plurality of opening/closing circuit units and then generates a reset command RST for the excessive-current occurrence memory circuit.

9. The load-driving integrated circuit device according to claim 6, wherein the calculation control circuit unit includes a program memory and a microprocessor that collaborates with the program memory, and is provided with a serial-parallel converter for performing upstream and downstream communication of serial signals with the monitoring control circuit unit by setting the microprocessor as a master station, and a direct line for receiving a parallel monitoring signal PAR transmitted from the monitoring control circuit unit, wherein through the downstream communication by the serial-parallel converter, the microprocessor transmits selection determination information indicating the application circuit selected by the application circuit selection calculator, to the monitoring control circuit unit, wherein the connection point potential detection circuit generates a potential level determination signal indicating the result of comparison between a reference potential and the potential of the connection point between the upper-side opening/closing device and the lower-side opening/closing device, wherein the monitoring control circuit unit has the opening/closing signal selection circuit that, in response to the selection determination information transmitted from the microprocessor and the logic level of the load driving command Son, generates a circuit-opening command signal for the upper and lower opening/closing devices of a non-selection circuit unit, which is an opening/closing circuit unit that is not selected as the application circuit, and generates the effective opening/closing signal S01, the ineffective opening/closing signal S10, or the common opening/closing signal S00, for the upper and lower opening/closing devices of the application circuit; and then utilize them as the upper-side and lower-side opening/closing timing signals, wherein the monitoring control circuit unit also has the abnormality determination processing device that sequentially issues a circuit-opening command for opening both the upper and lower opening/closing devices, a circuit-closing command for generating an upper-side circuit closing specification signal which closes only the upper-side opening/closing device, and a circuit-closing command for generating a lower-side circuit closing specification signal which closes only the lower-side opening/closing device, when the load driving command Son is a circuit-opening command; and that compares the state of the opening/closing command for the upper and lower opening/closing device with the potential level determination signal of the connection point potential detection circuit at a time when each of the opening/closing commands is issued and then separately determines whether or not a disconnection abnormality or a short-circuit abnormality exists in each of the opening/closing devices, and wherein, furthermore, the monitoring control circuit unit transmits abnormality occurrence information indicating an opening/closing circuit having an abnormality, and the kind of the abnormality, which are determined by the abnormality determination processing device, through the upstream communication by the serial-parallel converter, to the microprocessor, and transmits whether or not an abnormality has occurred, by means of the parallel monitoring signal PAR.

10. The load-driving integrated circuit device according to claim 6, wherein the calculation control circuit unit includes a program memory and a microprocessor that collaborates with the program memory, and is provided with a serial data line for performing upstream and downstream communication of multi-bit serial data SED with the monitoring control circuit unit by setting the microprocessor as a master station, wherein the calculation control circuit unit has the abnormality determination processing device and is provided with an abnormality-determination circuit-closing specification signal generation calculator that sequentially issues a circuit-opening command for opening both the upper and lower opening/closing devices, a circuit-closing command for generating an upper-side circuit closing specification signal which closes only the upper-side opening/closing device, and a circuit-closing command for generating a lower-side circuit closing specification signal which closes only the lower-side opening/closing device, when the load driving command Son is the circuit-opening command, wherein the serial data SED includes address designation data ADR for specifying to which opening/closing circuit unit among the plurality of opening/closing circuit units the right of communication is provided, a 2-bit selection command signal transmitted downstream in response to a setting command signal WR set by the microprocessor, a 4-bit monitoring reporting signal transmitted upstream in response to a detection command signal RD set by the microprocessor, and the upper-side and lower-side circuit closing specification signals transmitted downstream through a 2-bit dedicated line, wherein the selection command signal is a command signal that specifies which opening/closing device out of the upper and lower opening/closing devices is set for a circuit-opening command, specifies to which opening/closing device the effective opening/closing signal S01 or the common opening/closing signal S00 is provided, and specifies to which opening/closing device the ineffective opening/closing signal S10 or the common opening/closing signal S00 is provided, and the selection command signal is inputted to the opening/closing signal selection circuit, wherein the monitoring reporting signal includes a potential level determination signal generated by the connection point potential detection circuit, and wherein the program memory includes a control program that functions as the abnormality detection calculator which, when the load driving command Son is the circuit-opening command, compares the state of an opening/closing command for the upper and lower opening/closing devices with the logic state of the potential level determination signal at a time when a circuit-opening command for opening both the upper and lower opening/closing devices, a circuit-closing command for closing only the upper-side opening/closing device, and a circuit-closing command for closing only the lower-side opening/closing device are sequentially issued, and separately determines whether or not there exists a short-circuit abnormality and a disconnection abnormality in each of all the opening/closing devices; and the program memory includes a control program that functions as the application circuit selection calculator which determines selection of the application circuit from the plurality of opening/closing circuit units, based on the abnormality determination information.

* * * * *